US011276645B2

(12) United States Patent
Zhao et al.

(10) Patent No.: US 11,276,645 B2
(45) Date of Patent: Mar. 15, 2022

(54) ENCAPSULATION OF A SUBSTRATE ELECTRICALLY CONNECTED TO A PLURALITY OF PIN ARRAYS

(71) Applicant: HUAWEI TECHNOLOGIES CO., LTD., Shenzhen (CN)

(72) Inventors: Nan Zhao, Shenzhen (CN); Wenxu Xie, Shenzhen (CN); Junlei Tao, Shenzhen (CN); Shanghsuan Chiang, Shenzhen (CN); HuiLi Fu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/997,003

(22) Filed: Aug. 19, 2020

(65) Prior Publication Data

US 2020/0381361 A1 Dec. 3, 2020

Related U.S. Application Data

(63) Continuation of application No. PCT/CN2018/099006, filed on Aug. 6, 2018.

(30) Foreign Application Priority Data

Feb. 24, 2018 (CN) ......................... 201810157259.5

(51) Int. Cl.
*H01L 23/12* (2006.01)
*H01L 23/34* (2006.01)
(Continued)

(52) U.S. Cl.
CPC ...... *H01L 23/5381* (2013.01); *H01L 21/4853* (2013.01); *H01L 21/4857* (2013.01);
(Continued)

(58) Field of Classification Search
CPC . H01L 25/50; H01L 21/4853; H01L 21/4857; H01L 21/563; H01L 24/14;
(Continued)

(56) References Cited

U.S. PATENT DOCUMENTS 6,100,196 A 8/2000 Chan et al.
9,653,428 B1 5/2017 Hiner et al.
(Continued)

FOREIGN PATENT DOCUMENTS

CN 102709202 A 10/2012
CN 203774286 U 8/2014
(Continued)

*Primary Examiner* — Alonzo Chambliss
(74) *Attorney, Agent, or Firm* — Maier & Maier, PLLC

(57) ABSTRACT

A chip and a packaging method thereof. In the chip, first solder pads in a first solder pad array on a first substrate are attached to corresponding second pins in second pin arrays on different dies to implement short-distance and high-density interconnection of the different dies. A molding body is used to wrap a first pin, a second pin, a first solder pad, and the first substrate, so that a fan-out unit and the first substrate are molded into an integral structure. In the integral structure, bottoms of first pins that are in a first pin array on a die and that are electrically connected to a periphery of the chip are not wrapped by the molding body.

16 Claims, 15 Drawing Sheets

111 351 341 352 32 321 322 342 31 33 102 91 912 1011 911 1012 101

(51) Int. Cl.

| | |
|---|---|
| ***H01L 23/48*** | (2006.01) |
| ***H01L 21/00*** | (2006.01) |
| ***H01L 21/44*** | (2006.01) |
| ***H05K 7/20*** | (2006.01) |
| ***H05K 1/00*** | (2006.01) |
| ***H05K 7/00*** | (2006.01) |
| ***H01L 23/538*** | (2006.01) |
| ***H01L 21/48*** | (2006.01) |
| ***H01L 21/56*** | (2006.01) |
| ***H01L 23/31*** | (2006.01) |
| ***H01L 23/367*** | (2006.01) |
| ***H01L 23/00*** | (2006.01) |
| ***H01L 23/498*** | (2006.01) |
| ***H01L 25/00*** | (2006.01) |

(52) U.S. Cl.

CPC ........ *H01L 21/563* (2013.01); *H01L 23/3185* (2013.01); *H01L 23/3675* (2013.01); *H01L 23/49811* (2013.01); *H01L 23/49816* (2013.01); *H01L 23/5383* (2013.01); *H01L 23/5385* (2013.01); *H01L 23/5386* (2013.01); *H01L 23/562* (2013.01); *H01L 24/14* (2013.01); *H01L 24/16* (2013.01); *H01L 25/50* (2013.01); *H01L 2224/1403* (2013.01); *H01L 2224/16227* (2013.01); *H01L 2924/1431* (2013.01); *H01L 2924/18161* (2013.01); *H01L 2924/3511* (2013.01)

(58) Field of Classification Search

CPC . H01L 24/16; H01L 23/5381; H01L 23/3185; H01L 23/3675; H01L 23/5383; H01L 23/5385; H01L 23/562; H01L 23/5386; H01L 23/49816; H01L 23/49811; H01L 2924/181

See application file for complete search history.

(56) References Cited

U.S. PATENT DOCUMENTS

| | | | | |
|---|---|---|---|---|
| 9,735,043 | B2 * | 8/2017 | Ho | H01L 21/76251 |
| 10,833,052 | B2 * | 11/2020 | Shih | H01L 21/486 |
| 2014/0070380 | A1 | 3/2014 | Chiu et al. | |
| 2014/0117552 | A1 | 5/2014 | Qian et al. | |
| 2015/0262972 | A1 * | 9/2015 | Katkar | H01L 25/50<br>257/48 |
| 2017/0110407 | A1 | 4/2017 | Chaware et al. | |
| 2017/0125379 | A1 | 5/2017 | Chen et al. | |
| 2020/0118930 | A1 * | 4/2020 | Weng | H01L 25/0655 |
| 2021/0050327 | A1 * | 2/2021 | Shih | H01L 23/5381 |
| 2021/0111124 | A1 * | 4/2021 | Elsherbini | H01L 25/0655 |

FOREIGN PATENT DOCUMENTS

| | | | |
|---|---|---|---|
| CN | 105655310 | A | 6/2016 |
| CN | 107104096 | A | 8/2017 |
| CN | 107479283 | A | 12/2017 |
| WO | 2017114323 | A1 | 7/2017 |

* cited by examiner

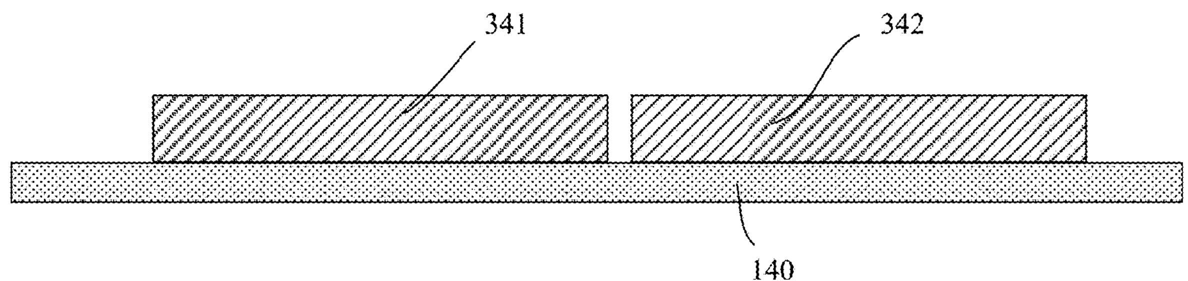
FIG. 15A1
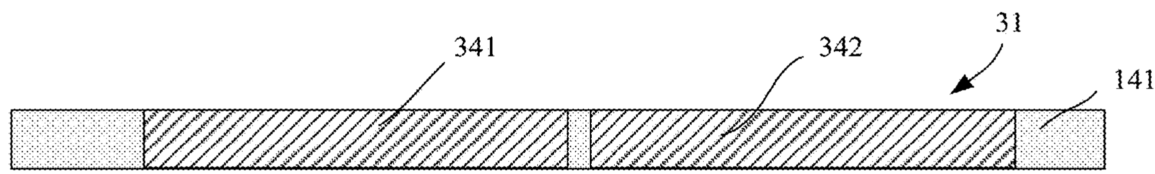
FIG. 15A2
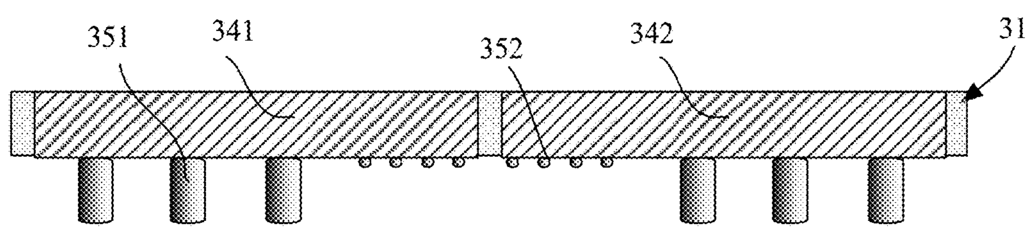
FIG. 15A3
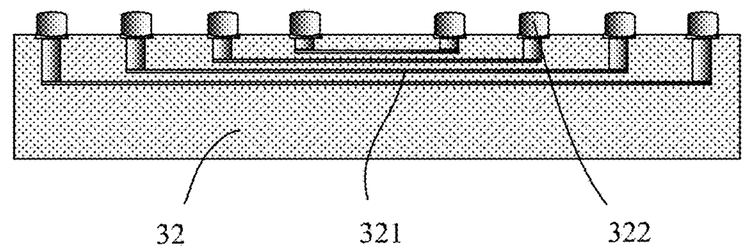
FIG. 15A4

FIG. 15A5

ENCAPSULATION OF A SUBSTRATE ELECTRICALLY CONNECTED TO A PLURALITY OF PIN ARRAYS

CROSS-REFERENCE TO RELATED APPLICATIONS

This application is a continuation of International Application No. PCT/CN2018/099006, filed on Aug. 6, 2018, which claims priority to Chinese Patent Application No. 201810157259.5, filed on Feb. 24, 2018, The disclosures of the aforementioned applications are hereby incorporated by reference in their entireties.

TECHNICAL FIELD

The embodiments relate to the field of semiconductor packaging technologies, and in particular, to a chip and a packaging method.

BACKGROUND

With continuous development of integrated electronic technologies, requirements on chip performance, for example, requirements for an enhanced function, a decreased size, and reduced energy consumption and costs, are increasingly higher. Accordingly, a 3DIC (Three Dimensional Integrated Circuit) technology emerges. A silicon interposer technology is a technical solution to implementing interconnection of stacked chips in a three-dimensional integrated circuit. In this technical solution, an interconnection line whose line width and node distance are much less than those of a resin substrate is manufactured on a silicon chip according to a semiconductor process. In this way, chips with different functions, such as a CPU and a DRAM, can be configured on a same silicon interposer, and a large quantity of operations and data exchanges can be completed through the silicon interposer. Therefore, density of chips stacked in a three-dimensional direction is greatly increased, an interconnection line between chips is shortened, an appearance size is decreased, noise is significantly reduced, an RC delay is decreased, chip speed performance is improved, power consumption is reduced, and the like.

However, currently, the 3DIC still has many bottlenecks to be overcome, for example, a low wafer thinning yield rate, high difficulties in a process of leading out signals of stacked chips, high difficulties in a through silicon via (TSV) process used for chip interconnection, and a heat dissipation problem caused after high-power chips are stacked.

Through a fan-out wafer-level package (FoWLP), I/O pins on a single chip may be led out on a wafer through a re-distribution layer, so that a single package area is increased and a quantity of overall I/O pins is increased. Design difficulties of the fan-out wafer-level package are not only lower than those of the through silicon via the 3DIC, and a package structure is close to a 2.5D IC. Therefore, the fan-out wafer-level package is expected to become a key point of development of advanced packaging technologies.

However, in an existing fan-out wafer-level package structure, pins that are on a die and that are configured to electrically connect to a periphery of the package structure can be electrically connected to the periphery of the package structure only through a substrate. As a result, an overall size of the package structure is relatively large, and a requirement on chip miniaturization cannot be met.

SUMMARY

In view of this, embodiments provide a chip and a packaging method, to decrease an overall size of a chip and meet a requirement on chip miniaturization.

To achieve the foregoing objectives, the embodiments use the following solutions.

A first aspect provides a chip, including a fan-out unit, a first substrate, and a molding body, where the fan-out unit includes a plurality of dies that are integrated together and that are arranged according to preset positions, and a first pin array and a second pin array are disposed on a first surface of each die; the first pin array includes a plurality of first pins, and the second pin array includes a plurality of second pins; and second pin arrays on adjacent dies are adjacent;

the first substrate includes a first surface, a first re-distribution layer and a first solder pad array electrically connected to the first re-distribution layer disposed on the first surface of the first substrate, and the first solder pad array includes a plurality of first solder pads;

the first substrate is located below the fan-out unit, the first solder pad array is disposed opposite to the second pin array, and each second pin in the second pin array is attached to a corresponding first solder pad in the first solder pad array, so that the different dies are interconnected through the first substrate; and the molding body is used to wrap the first pin, the second pin, and the first substrate, so that the fan-out unit and the first substrate are molded into an integral structure.

In the chip provided in the first aspect, the first solder pads in the first solder pad array on the first substrate are attached to the corresponding second pins in the second pin arrays on the different dies to implement short-distance and high-density interconnection of the different dies. The molding body is used to wrap the first pin, the second pin, the first solder pad, and the first substrate, so that the fan-out unit and the first substrate are molded into an integral structure. In the integral structure, bottoms of first pins that are in the first pin array on the die and that are electrically connected to a periphery of the chip are not wrapped by the molding body. In this way, the first pins may be directly electrically connected to the periphery of the chip. Therefore, based on the chip provided in this embodiment, a pin that is on the die and that is configured to electrically connect to the peripheral of the chip may be directly electrically connected to the peripheral of the chip, without using a substrate as an intermediary. Therefore, an overall size of the chip provided in this embodiment mainly depends on a size of a plurality of dies integrated together. The overall size of the chip provided in this embodiment is relatively small compared with that of a chip in the prior art and can meet a requirement on chip miniaturization.

With reference to the first aspect, in a first possible implementation, the chip further includes a second substrate, and the second substrate is directly disposed below the molding body according to a distribution layer build-up process;

a second re-distribution layer is disposed on the second substrate, the second substrate includes a first surface and a second surface opposite to each other, a second solder pad array electrically connected to the second re-distribution layer is disposed on the first surface of the second substrate, and the second solder pad array includes a plurality of second solder pads; and a third solder pad array is disposed on the second surface of the second substrate, and the third solder pad array includes a plurality of third solder pads; and the second solder pad array is disposed opposite to the first pin array, and each second solder pad in the second solder pad array is electrically connected to a corresponding first pin in the first pin array.

In the first possible implementation, an electrical connection between the chip and a peripheral circuit of the chip is no longer limited by sizes and an arrangement of pins on the die. Therefore, based on the chip structure, limitations caused by the arrangement of the pins on the die on the electrical connection between the chip and the peripheral circuit of the chip can be reduced.

With reference to the first aspect and the first possible implementation of the first aspect, in a second possible implementation, a through via electrically connected to the first re-distribution layer is disposed inside the first substrate, the through via extends to a second surface of the first substrate, and the through via is electrically connected to the periphery of the chip, where the second surface of the first substrate is opposite to the first surface of the first substrate.

In the second possible implementation, the through via facilitates signal transmission between the first substrate and the periphery of the chip.

With reference to any one of the first aspect, or the first to the second possible implementations of the first aspect, in a third possible implementation, the chip further includes a third substrate disposed below the second substrate;

the third substrate includes a first surface and a second surface opposite to each other, a fourth solder pad array is disposed on the first surface of the third substrate, a fifth solder pad array is disposed on the second surface of the third substrate, the fourth solder pad array includes a plurality of fourth solder pads, and the fifth solder pad array includes a plurality of fifth solder pads;

the fourth solder pad array is opposite to the third solder pad array, and each fourth solder pad in the fourth solder pad array is electrically connected to a corresponding third solder pad in the third solder pad array; and the fifth solder pad in the fifth solder pad array is configured to implement signal transmission between the chip and the periphery of the chip.

In the third possible implementation, based on the chip, routing resources of the chip and a quantity of packaged pins can be further increased, integrity of a packaged power supply can be improved, and board-level reliability of the chip can be improved.

With reference to any one of the first aspect, or the first to the third possible implementations of the first aspect, in a fourth possible implementation, the chip further includes a heat sink disposed on a second surface of the die, and the second surface of the die is opposite to the first surface of the die.

In the fourth possible implementation, heat dissipation performance of the chip can be improved.

With reference to the fourth possible implementation of the first aspect, in a fifth possible implementation, the chip includes the third substrate disposed below the second substrate; and the heat sink masks the fan-out unit, and an edge of the heat sink is fastened on the third substrate.

In the fifth possible implementation, not only the heat dissipation performance of the chip can be improved, but also warp of the entire chip structure and reliability of the chip can be controlled.

With reference to the third possible implementation of the first aspect, in a sixth possible implementation, an underfill is filled between the second substrate and the third substrate.

In the sixth possible implementation, a filling effect of a gap between the first solder pads in the first solder pad array can be improved, thereby improving the reliability of the chip.

With reference to any one of the first aspect, or the first to the sixth possible implementations of the first aspect, in a seventh possible implementation, the underfill in filled in the gap between the first solder pads in the first solder pad array.

In the seventh possible implementation, stress between the first pin and the second substrate can be alleviated, thereby improving the reliability of the entire chip structure.

With reference to any one of the first aspect, or the first to the seventh possible implementations of the first aspect, in an eighth possible implementation, a material for manufacturing the first substrate is at least one of a silicon-based material, a resin material, or a glass material. In the eighth possible implementation, chip costs can be reduced.

With reference to any one of the first aspect, or the first to the eighth possible implementations of the first aspect, in a ninth possible implementation, the die is a passive die or a functional die.

With reference to any one of the first aspect, or the first to the ninth possible implementations of the first aspect, in a tenth possible implementation, the second pin includes at least one of a Cu pillar or a solder bump. In the tenth possible implementation, flexibility of the chip structure can be improved.

With reference to any one of the first aspect, or the first to the tenth possible implementations of the first aspect, in an eleventh possible implementation, at least one interconnection structure is formed between different dies that are interconnected, and each interconnection structure includes a plurality of interconnection lines.

With reference to the eleventh possible implementation of the first aspect, in a twelfth possible implementation, all interconnection lines in a same interconnection structure have an equal length. In the twelfth possible implementation, signal quality can be improved and crosstalk between signals can be reduced.

With reference to any one of the first aspect, or the first to the twelfth possible implementations of the first aspect, in a thirteenth possible implementation, the first re-distribution layer includes n layers of first re-distribution sublayers, $n \geq 1$, and n is an integer.

With reference to any one of the first aspect, or the first to the thirteenth possible implementations of the first aspect, in a fourteenth possible implementation, $n \geq 2$, the n layers of first re-distribution sublayers include a reference layer and a line layer, and a plane in which the reference layer is located is a reference plane of the line layer. In the fourteenth possible implementation, the signal quality can be improved and the crosstalk between signals can be reduced.

With reference to the third possible implementation of the first aspect, in a fifteenth possible implementation, the third substrate is a multilayer substrate manufactured by laser grinding or a multilayer substrate manufactured by mechanical grinding.

With reference to any one of the first aspect, or the first to fifteenth possible implementations of the first aspect, in a sixteenth possible implementation, a logical chip is disposed on the first substrate.

A second aspect provides a chip packaging method, where the chip packaging method includes:

separately manufacturing a fan-out unit and a first substrate, where the fan-out unit includes a plurality of dies that are integrated together and that are arranged according to preset positions, and a first pin array and a second pin array are disposed on a first surface of each die; the first pin array includes a plurality of first pins, and the second pin array includes a plurality of second pins; and second pin arrays on adjacent dies are adjacent; and the first substrate includes a first surface, a first re-distribution layer and a first solder pad array electrically connected to the first re-distribution layer are disposed on the first surface of the first substrate, and the first solder pad array includes a plurality of first solder pads;

placing the first substrate below the fan-out unit, and attaching each second pin in the second pin array to a corresponding first solder pad in the first solder pad array, so that the different dies are interconnected through the first substrate; and molding, by using a molding compound, the fan-out unit and the first substrate that are attached together, to form a molding body that wraps the first pins, the second pins, and the first substrate.

In the chip packaging method provided in the second aspect, the chip includes the fan-out unit, the first substrate, and the molding body. The first solder pads in the first solder pad array on the first substrate are attached to the corresponding second pins in the second pin arrays on the different dies to implement short-distance and high-density interconnection of the different dies. The molding body is used to wrap the first pin, the second pin, and the first substrate, so that the fan-out unit and the first substrate are molded into an integral structure. In the integral structure, bottoms of first pins that are in the first pin array on the die and that are electrically connected to a periphery of the chip are not wrapped by the molding body. In this way, the first pins may be directly electrically connected to the periphery of the chip. Therefore, based on the chip packaging method provided in the second aspect, a pin that is on the die and that is configured to electrically connect to the peripheral of the chip may be directly electrically connected to the peripheral of the chip, without using a substrate as an intermediary. Therefore, an overall size of the chip manufactured according to this method mainly depends on a size of the fan-out unit. The overall size of the chip manufactured according to this method is relatively small compared with that in the prior art, and can meet a requirement on chip miniaturization.

With reference to the second aspect, in a first possible implementation, the method further includes:

when the molding body wraps bottoms of the first pins in the first pin array, grinding a surface that is of the molding body and that is away from the fan-out unit, to expose the bottoms of the first pins in the first pin array; and manufacturing, according to a distribution layer build-up process, a second substrate on the surface on which the bottoms of the first pins in the first pin array are exposed, where a second re-distribution layer is disposed on the second substrate, the second substrate includes a first surface and a second surface opposite to each other, a second solder pad array electrically connected to the second re-distribution layer is disposed on the first surface of the second substrate, and the second solder pad array includes a plurality of second solder pads; and a third solder pad array is disposed on the second surface of the second substrate, and the third solder pad array includes a plurality of third solder pads; and the second solder pad array is disposed opposite to the first pin array, and each second solder pad in the second solder pad array is electrically connected to a corresponding first pin in the first pin array.

In the first possible implementation, an electrical connection between the chip and a peripheral circuit of the chip is no longer limited by sizes and an arrangement of pins on the die. Therefore, based on the chip structure manufactured according to this method, limitations caused by the arrangement of the pins on the die on the electrical connection between the chip and the peripheral circuit of the chip can be reduced.

With reference to the first possible implementation of the second aspect, in a second possible implementation, the manufacturing a second substrate on the surface on which the bottoms of the first pins in the first pin array are exposed includes:

coating a dielectric layer on the surface on which the bottoms of the first pins in the first pin array are exposed, then manufacturing a re-distribution layer on a surface of the dielectric layer, and stacking the re-distribution layer layer-by-layer until the second re-distribution layer is manufactured; and when manufacturing the second re-distribution layer, manufacturing the second solder pad array at a position opposite to the first pin array, where the second solder pad array includes a plurality of second solder pads; and one second solder pad corresponds to one second solder pad; and after the second re-distribution layer and the second solder pad array are manufactured, continuing coating a dielectric layer, and then manufacturing the third solder pad array including the plurality of third solder pads on a surface of the dielectric layer.

In the second possible implementation, even if a die has high pin density, an electrical connection between the die and a peripheral circuit of the chip can be conveniently implemented. Therefore, based on the chip structure formed in this embodiment, limitations caused by the arrangement of the pins on the die on the electrical connection between the chip and the peripheral circuit of the chip can be reduced.

With reference to either of the first possible implementation and the second possible implementation of the second aspect, in a third possible implementation, the chip packaging method further includes:

manufacturing a third substrate, where the third substrate includes a first surface and a second surface opposite to each other, a fourth solder pad array is disposed on the first surface of the third substrate, a fifth solder pad array is disposed on the second surface of the third substrate, the fourth solder pad array includes a plurality of fourth solder pads, and the fifth solder pad array includes a plurality of fifth solder pads; and after the manufacturing of a second substrate on the surface on which the bottoms of the first pins in the first pin array are exposed, the chip packaging method further includes:

placing the third substrate below the second substrate, making the fourth solder pad array opposite to the third solder pad array, and attaching each fourth solder pad in the fourth solder pad array to a corresponding third solder pad in the third solder pad array, so that the fourth solder pad in the fourth solder pad array is electrically connected to the corresponding third solder pad in the third solder pad array.

In the third possible implementation, the electrical connection between the chip and the peripheral circuit of the chip is no longer limited by the sizes and the arrangements of the pins on the die. Therefore, based on the chip structure, the limitations caused by the arrangement of the pins on the die on the electrical connection between the chip and the peripheral circuit of the chip can be reduced.

With reference to the third possible implementation of the second aspect, in a fourth possible implementation, after the placing the third substrate below the second substrate, and attaching each fourth solder pad in the fourth solder pad array to a corresponding third solder pad in the third solder pad array, the method further includes:

filling an underfill between the second substrate and the third substrate.

In the fourth possible implementation, a filling effect of a gap between the first solder pads in the first solder pad array can be improved, thereby improving reliability of the chip.

With reference to any one of the first to the fourth possible implementations of the second aspect, in a fifth possible implementation, before the molding, by using a molding compound, the fan-out unit and the first substrate that are attached together, the method further includes:

filling the underfill in a gap between the first solder pads in the first solder pad array.

With reference to any one of the first possible implementation to the fifth possible implementation of the second aspect, in a sixth possible implementation, the chip packaging method further includes:

disposing a heat sink on a second surface of the die, where the second surface of the die is opposite to the first surface of the die.

In the sixth possible implementation, the chip manufactured according to this method has desirable heat dissipation performance.

With reference to any one of the first to the sixth possible implementation of the second aspect, in a seventh possible implementation, before the disposing a heat sink on a second surface of the die, the method further includes:

grinding a surface that is of the fan-out unit and that is away from the second substrate, to expose the second surface of the die.

With reference to any one of the third possible implementation of the second aspect, in an eighth possible implementation, the chip packaging method further includes:

disposing a heat sink on a surface that is of the fan-out unit and that is away from the second substrate, where the heat sink masks the fan-out unit, and an edge of the heat sink is fastened on the third substrate.

In the eighth possible implementation, according to this method, not only the heat dissipation performance of the chip can be improved, but also warp of the entire chip structure and the reliability of the chip can be controlled.

Compared with the prior art, the embodiments include the following beneficial effects.

It can be understood based on the foregoing solutions that, in the chip provided in the embodiments, the first solder pads in the first solder pad array on the first substrate are attached to the corresponding second pins in the second pin arrays on the different dies to implement short-distance and high-density interconnection of the different dies. The molding body is used to wrap the first pin, the second pin, the first solder pad, and the first substrate, so that the fan-out unit and the first substrate are molded into an integral structure. In the integral structure, the bottoms of the first pins that are in the first pin array on the die and that are electrically connected to the periphery of the chip are not wrapped by the molding body. In this way, the first pins may be directly electrically connected to the periphery of the chip. Therefore, based on the chip provided in the embodiments, a pin that is on the die and that is configured to electrically connect to the peripheral of the chip may be directly electrically connected to the peripheral of the chip, without using a substrate as an intermediary. Therefore, the overall size of the chip provided in the embodiments mainly depends on a size of a plurality of dies integrated together. The overall size of the chip provided in the embodiments is relatively small compared with that of a chip in the prior art, and can meet a requirement on chip miniaturization.

BRIEF DESCRIPTION OF DRAWINGS

FIG. 4' is a top view of a chip according to an embodiment;

FIG. 11' is a top view of the chip in FIG. 11 according to an embodiment;

FIG. 15A1 is a schematic structural diagram of one of a series of corresponding manufacturing processes of a chip packaging method according to an embodiment;

FIG. 15A2 is a schematic structural diagram of one of a series of corresponding manufacturing processes of a chip packaging method according to an embodiment;

FIG. 15A3 is a schematic structural diagram of one of a series of corresponding manufacturing processes of a chip packaging method according to an embodiment;

FIG. 15A4 is a schematic structural diagram of one of a series of corresponding manufacturing processes of a chip packaging method according to an embodiment;

FIG. 15A5 is a schematic structural diagram of one of a series of corresponding manufacturing processes of a chip packaging method according to an embodiment;

DESCRIPTION OF EMBODIMENTS

Before implementations of the embodiments are described, acronyms and abbreviations, and definitions of key terms used in the embodiments are first described.

| Acronyms and abbreviations | Full Name in English |
|---|---|
| 3DIC | Three Dimensional Integrated Circuit |
| Substrate | Substrate |
| TSV | Through Silicon Via |
| RDL | Re-Distribution Layer |
| FoWLP | Fan-out Wafer Level Package |
| PCB | Print Circuit Board |
| 2.5D FOP | 2.5 Dimensional Fan Out Package |
| 2.5D SBAFOP | 2.5 Dimensional substrate bridge across fanout package |
| PI | Polyimide |
| PBO | Poly-p-phenylenebenzobisthiazole |
| UBM | Under Bump Metallization |
| TIM | Thermal Interface Materials |
| DRIE | Deep Reactive Ion Etching |
| PVD | Physical Vapor Deposition |

Through a fan-out wafer-level package, I/O pins on a single chip may be led out on a wafer through a re-distribution layer, so that a single package area is increased and a quantity of overall I/O pins is increased. Design difficulties of the fan-out wafer-level package are not only lower than those of the through silicon via 3DIC, and a package structure is close to a 2.5D IC. Therefore, the fan-out wafer-level package is expected to become a key point of development of advanced packaging technologies.

Figure 1:
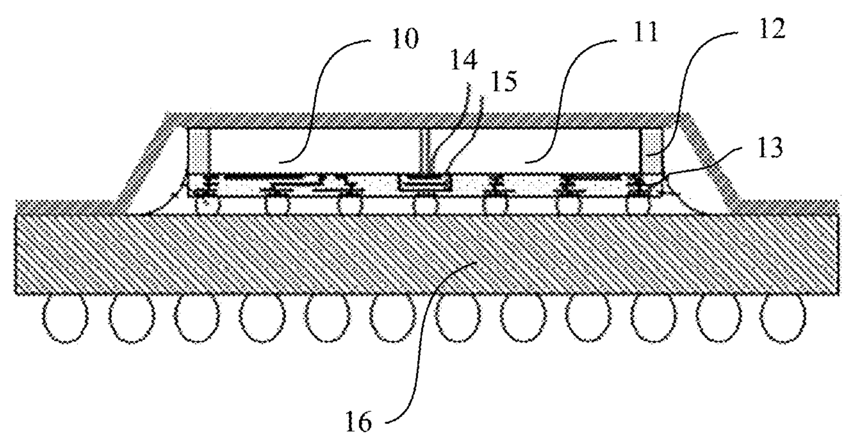
FIG. 1 is a schematic sectional view of a fan-out wafer-level package structure commonly used in this field.

At present, some fan-out wafer-level package technologies emerge in the industry. An existing fan-out package structure is shown in FIG. 1. The fan-out package structure is a 2.5D FOP package structure combining a conventional fan-out wafer-level package and a flip chip.

A packaging process of the package structure is as follows: First, a plurality of to-be-integrated dies 10 and 11 are placed in parallel on a carrier according to specific distances and locations, where a size of the carrier may be the same as an original size of a wafer. Then, the plurality of to-be-integrated dies 10 and 11 are molded by using a molding compound 12 to form a reconstructed wafer. Then, re-routing is performed on the reconstructed wafer, that is, a fan-out distribution layer 13 is manufactured on a front face of a die on the reconstructed wafer. The fan-out distribution layer 13 may electrically extend I/O pins on the dies 10 and 11 to an area outside the dies 10 and 11 through high-density interconnection structures 14 and 15. In this way, an electrical connection between the dies and a PCB board 16 is not limited to sizes and an arrangement of the dies 10 and 11.

The package structure shown in FIG. 1 uses a wafer-level manufacturing process, so that both packaging and testing can be completed on a wafer. According to the package structure, a quantity of packaged pins can be effectively increased, and requirements of an advanced process node and a higher chip function for a larger quantity of pins can be met. In addition, the 2.5D FOP package can implement integration and packaging of a plurality of dies, and implement short-distance and high-density interconnection of dies through the fan-out distribution layer without through a substrate. However, the package structure has the following disadvantages.

First, the dies 10 and 11 are interconnected through the fan-out re-distribution layer 13. However, in a process of manufacturing a plurality of layers of large-area and large-size fan-out distribution layers 13 on the reconstructed wafer, the reconstructed wafer is affected by photoetching, exposure, and development processes. Consequently, stress is uneven, and a warp or even deformation is caused. However, the dies on the reconstructed wafer are all qualified dies that have been tested. If a defect is caused in a subsequent manufacturing process of the fan-out distribution layer 13, the qualified dies are wasted. This causes an increase in costs.

Second, both a line width and a line distance of the fan-out distribution layer manufactured on the reconstructed wafer can reach only 2 μm, and process implementation is difficult. In this case, chip interconnection density, chip signal integrity, and power supply integrity are limited.

Figure 2:
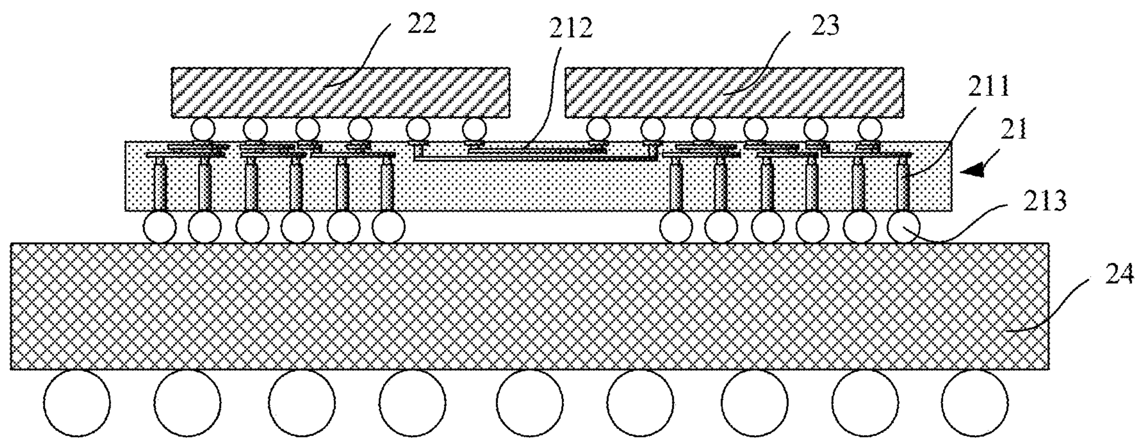
FIG. 2 is a schematic sectional view of another fan-out wafer-level package structure commonly used in this field.

To overcome defects of the fan-out package structure shown in FIG. 1, another fan-out package structure emerges in the industry. The fan-out package structure is a 2.5D TSV package structure combining a flip chip and a silicon interposer (Si Interposer) having a through silicon via. The fan-out package structure is shown in FIG. 2. A packaging process of the fan-out package structure is as follows.

First, a through silicon via 211 is manufactured on a silicon wafer, and a single layer of re-distribution layer 212 or a plurality of layers of re-distribution layers 212 are manufactured on a surface of the silicon wafer, to form a silicon interposer 21 used for signal connection.

Then, a plurality of to-be-integrated dies 22 and 23 are placed on a front face of the silicon interposer 21 according to pre-designed positions, and then the dies 22 and 23 are soldered to the front face of the silicon interposer 21 according to a soldering process.

Finally, the silicon interposer 21 is soldered to a package substrate 24 through an electrical connection structure 213 on a back face of the silicon interposer 21. In this way, an I/O pin on the die is fanned out to the package substrate 24 through the re-distribution layer 212 and the through silicon via 211 on the silicon interposer 21, and an interconnection structure is formed between different dies through the re-distribution layer 212.

The 2.5D TSV package structure shown in FIG. 2 uses a silicon interposer and a TSV technology, and implements interconnection of different dies on a silicon wafer. An extremely minimum line width and an extremely minimum line distance are implemented by using a silicon material according to a mature semiconductor manufacturing process (currently, both a minimum line width and a minimum line distance of the silicon interposer are 0.4 μm), signal interconnection density of chips is greatly increased, and a signal routing distance is shortened. However, the package structure has the following advantages.

A plurality of to-be-integrated dies need to be soldered on a silicon interposer. In this case, a size of the silicon interposer needs to be greater than a sum of sizes of all the dies, and more materials are consumed.

Figure 3A:
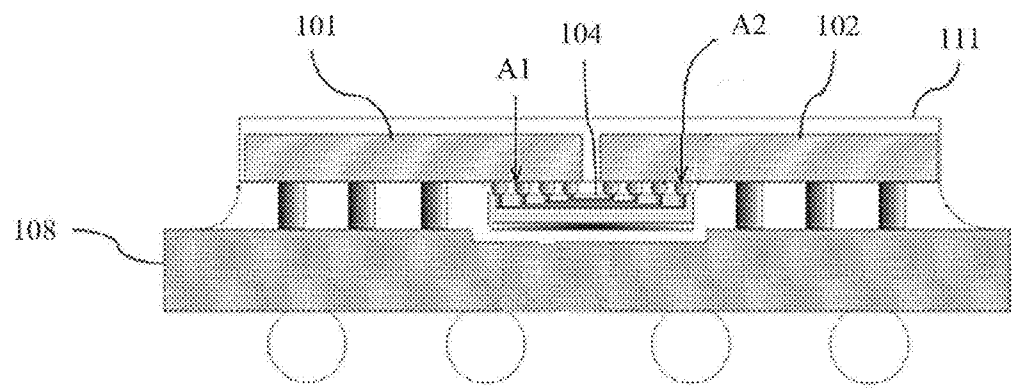
FIG. 3A is a schematic sectional view of a chip according to an embodiment.
Figure 3B:
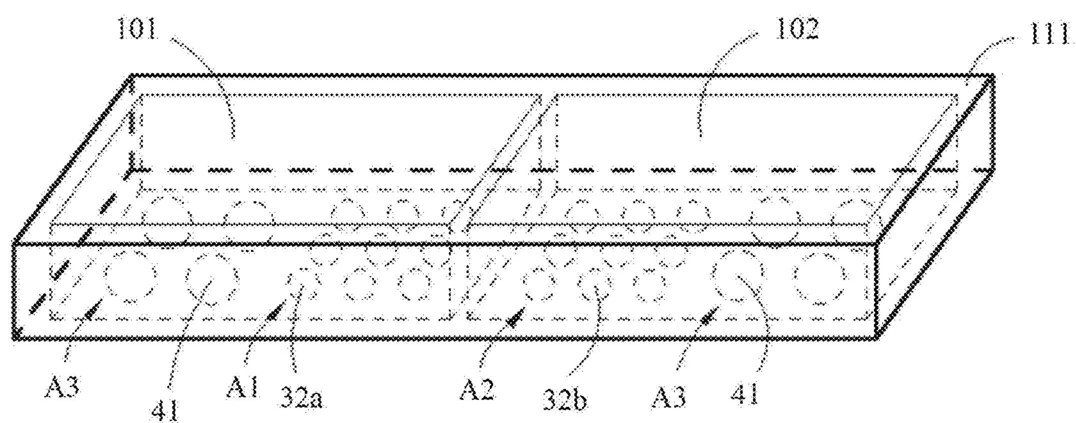
FIG. 3B is a schematic diagram of a fan-out unit in a chip according to an embodiment.

Based on this, to resolve problems that exist in the fan-out wafer-level package technology, of high packaging costs, a relatively large line width and distance, and high process implementation difficulties, an embodiment provides a chip. Referring to FIG. 3A, a structure of the chip is a 2.5D substrate bridge across a fan-out package structure. As shown in FIG. 3A, the chip includes:

a substrate 108, a fan-out unit 111, and a distribution layer 104, where the fan-out unit 111 includes a first chip 101 and a second chip 102. FIG. 3B schematically shows a structure of the fan-out unit 111, where hidden lines (invisible lines in a view direction) are represented by dashed lines. The first chip 101 includes a first pin array A1, and the first pin array A1 includes a plurality of first pins 32*a*. The second chip 102 includes a second pin array A2, and the second pin array A2 includes a plurality of second pins 32*b*. The fan-out unit 111 further includes a third pin array A3, and the third pin array A3 includes a plurality of third pins 41. The first pin array A1, the second pin array A2, and the third pin array A3 are all disposed facing the substrate 108. Surfaces that are of the first chip 101 and the second chip 102 and that face the substrate 108 are defined as front faces, and surfaces opposite to the front faces are defined as back faces. The first pin array A1, the second pin array A2, and the third pin array A3 are distributed on the front faces of the first chip 101 and the second chip 102. In this implementation, the first chip 101 and the second chip 102 are adjacently disposed, the first pin array A1 and the second pin array A2 are adjacently disposed, and the third pin array A3 is distributed in an area, other than areas of the first pin array A1 and the second pin array A2, on the fan-out unit 111. That the first chip 101 and the second chip 102 are adjacently disposed indicates that the first chip 101 and the second chip 102 are not separated from each other by another chip.

In the chip shown in FIG. 3A, the distribution layer 104 is bridged between the first pin array A1 and the second pin array A2, and is used to connect the first pins 32*a* in the first pin array A1 to the corresponding second pins 32*b* in the second pin array A2. In this way, an electrical connection between the first chip 101 and the second chip 102 is implemented, and no intermediate board with a through via structure needs to be disposed. In addition, a manufacturing process of the distribution layer 104 is simple (which can be implemented according to a common build-up process), and costs are low. Moreover, the third pin array A3 is directly connected to the substrate 108, so that a large-area intermediate board does not need to be disposed for a connection between the fan-out unit 111 and the substrate 108, and a process of manufacturing a through via on the intermediate board is omitted. Therefore, the chip shown in FIG. 3A has advantages of low process difficulties and low costs.

However, in the chip shown in FIG. 3A, the third pins in the third pin array A3 on the fan-out unit 111 can be connected to a periphery of the chip only through the substrate 108. In this case, components that affect an overall size of the chip include the fan-out unit 111 and the substrate 108. Consequently, the overall size of the chip is relatively large, and a requirement on chip miniaturization cannot be met.

To decrease the overall size of the chip and meet the requirement on chip miniaturization, an embodiment provides another structure of the chip.

The following describes in detail an implementation of the chip provided in this embodiment with reference to the accompanying drawings.

Figure 4:
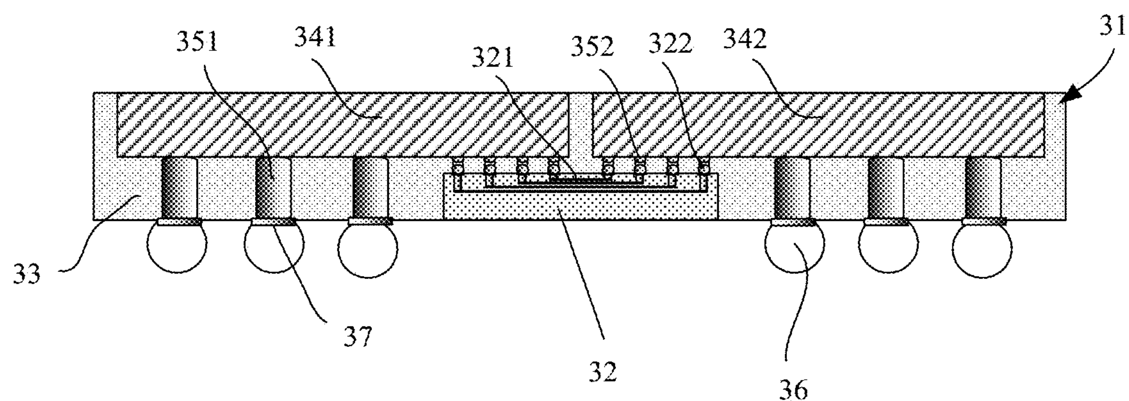
FIG. 4 and FIG. 4' is a schematic sectional view of a chip according to an embodiment.
Figure 4:
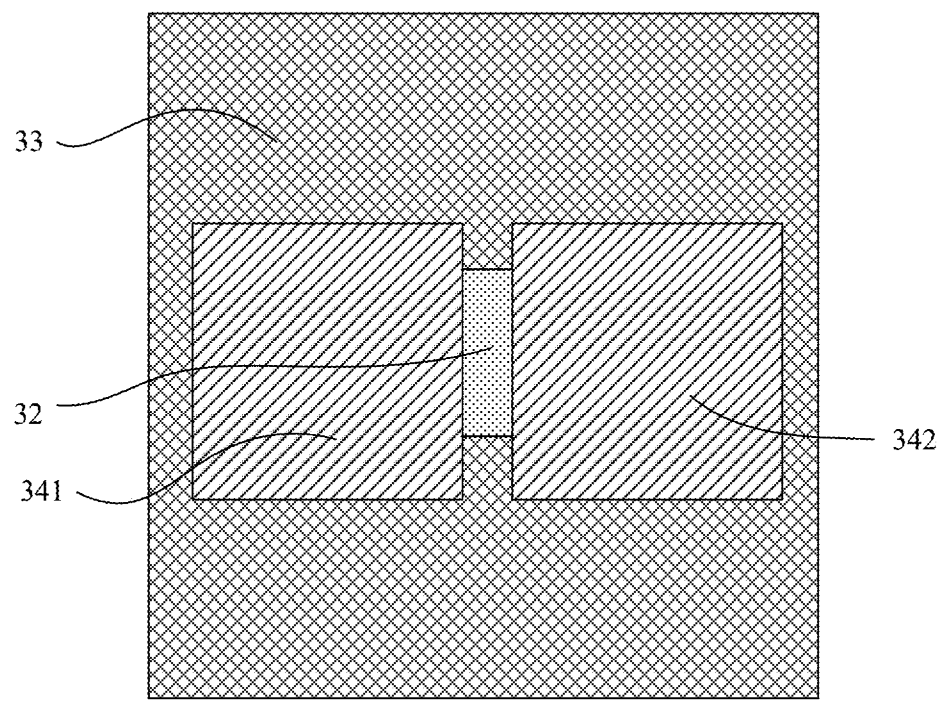

Referring to FIG. 4 and FIG. 4', FIG. 4 is a schematic sectional view of a chip structure according to an embodiment and FIG. 4' is a top view of the chip structure according to this embodiment. As shown in FIG. 4 and FIG. 4', the chip provided in this embodiment includes:

a fan-out unit 31, a first substrate 32, and a molding body 33.

The fan-out unit 31 includes a plurality of dies 341 and 342 that are integrated together and that are arranged according to preset positions. In this embodiment, the plurality of dies integrated together may be two dies, or may be more than two dies. In an example, in this embodiment, an example in which the plurality of to-be-integrated dies are two dies is used for description.

In this embodiment, the dies 341 and 342 may be integrated together by using a molding compound according to a molding process, to form the fan-out unit 31.

Figure 5:
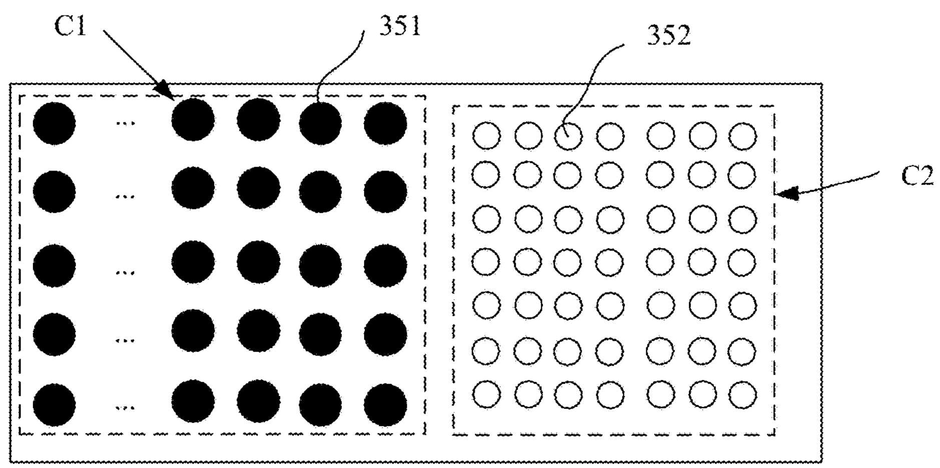
FIG. 5 is a schematic structural diagram of a first surface of a die according to an embodiment.

To clearly understand front structures of the dies 341 and 342, an embodiment further provides a schematic structural diagram of first surfaces of the dies 341 and 342. Details are shown in FIG. 5. A first pin array C1 and a second pin array C2 are disposed on the first surface of the die 341 or 342; the first pin array C1 includes a plurality of first pins 351, and the second pin array C2 includes a plurality of second pins 352; and second pin arrays C2 on adjacent dies are adjacent; and the first substrate 32 includes a first surface, a first re-distribution layer 321 and a first solder pad array electrically connected to the first re-distribution layer 321 are disposed on the first surface of the first substrate 32, and the first solder pad array includes a plurality of first solder pads 322.

In this embodiment, the first surfaces of the dies 341 and 342 are opposite to the first surface of the first substrate 32, the first substrate 32 is located below the fan-out unit 31, the first solder pad array is disposed opposite to the second pin array C2, and each second pin 352 in the second pin array C2 is attached to a corresponding first solder pad 322 in the first solder pad array, so that the different dies 341 and 342 are interconnected through the first re-distribution layer 321 on the first substrate 32.

The molding body 33 is used to wrap the first pin 351, the second pin 352, the first solder pad 322, and the first substrate 32, so that the fan-out unit 31 and the first substrate 32 are molded into an integral structure.

It can be noted that, in this embodiment, the molding body 33 is formed according to a molding process after the first solder pad array on the first substrate 32 and the second pin arrays C2 on the dies 341 and 342 are attached together. The molding process may be a compression molding process. Therefore, the molding body 33 wraps at least a side face of the first pin 351, a side face of the second pin 352, a side face of the first solder pad 322, and a side face of the first substrate 32. In addition, to lead out the first pins 351 in the first pin array C1 on the dies 341 and 342 to a periphery of the chip, the molding body 33 does not wrap bottoms of the first pins 351. In other words, the bottoms of the first pins 351 are exposed outside the molding body 33.

In an example, in addition to the side face of the first substrate 32, the molding body 33 may further wrap a back face of the first substrate 32, so that an area in which the first pin array is molded and an area in which the first substrate 32 is located are of a flat-surface structure. In other words, a surface of the integral structure formed through molding is a flat surface.

It can be noted that, for a structure formed by the fan-out unit 31 and the first substrate 32 that are attached together, due to a lack of a protective layer, the structure has relatively low stability, and there is a relatively low possibility for the structure to work independently. Based on this, the molding body 33 wraps the side face of the first pin 351, the side face of the second pin 352, and the side face of the first solder pad 322. In this way, a service life and reliability of the entire chip can be improved. In addition, because the molding body 33 has a stable structure and high mechanical strength, the molding body 33 can effectively support independent use and work of the overall structure. Therefore, the integral structure that is formed by molding the fan-out unit 31 and the first substrate 32 together according to the compression molding process can work stably and independently, or an RDL carrier board may be manufactured on the integral structure as required or desired, or the integral structure may be bonded with a substrate as required or desired, to form a larger package structure.

To lead out the first pins 351 on the dies 341 and 342 to the periphery of the chip, a solder ball 36 may be disposed at the bottom of each first pin 351, and each solder ball 36 may be electrically connected to an external circuit such as a PCB board. In an example, to implement a better electrical connection between the first pin 351 and the solder ball 36, a solder pad 37 may be further disposed between each first pin 351 and the solder ball 36.

It can be noted that, in this embodiment, a molding material used to form the molding body 33 has different components from an underfill in the prior art. The molding material and the underfill are obtained by adding different additives to an epoxy molding compound.

In this embodiment, the molding body 33 formed by using the molding material is generally implemented according to the compression molding process. The compression molding process is quite different from an underfill dispensing process. There are two types of compression molding processes: a face-up type and a face-down type. In the face-up type, a to-be-molded structure is placed below a flowing molding material, the flowing molding material flows downward and is perfused on the to-be-molded structure, and then a mold is used to press-fit the perfused structure. In the face-down type, a to-be-molded structure is placed above a container containing a flowing molding material, the to-be-molded structure is immersed into the container containing the flowing molding material, the to-be-molded structure is taken out from the container, and then a mold is used to press-fit the to-be-molded structure. In this case, the compression molding process can complete filling and curing of a large quantity of chips on an entire wafer at a time, and does not need to fill chips one by one, so that overall efficiency is relatively high.

In addition, the curing in the compression molding process includes initial curing performed in a press-fitting state and final curing performed after the press-fitting is completed and the molded structure is placed in a heating furnace.

A structure body with a stable structure can be formed by wrapping the die and the substrate by using the molding body 33, and the structure body can be directly mounted onto a terminal device.

The underfill dispensing process is as follows. When filling is performed by using an underfill, all chips on an entire wafer need to be dispensed one by one, and dispensing positions are on four edges of each chip, the underfill is attracted and filled into a gap between a chip and a substrate or another dielectric material through a capillary action, to complete a filling process. After the filling is completed, the filled structure is placed into the heating furnace to complete the final curing. Therefore, the filling process takes a relatively long time, and filling efficiency is relatively low.

In addition, if the structure formed by the fan-out unit 31 and the first substrate 32 is filled according to the foregoing underfill dispensing process, to protect the die and the entire structure, the underfill dispensing process needs to be performed after the structure formed by the fan-out unit 31 and the first substrate 32 is connected to another structure such as a substrate. However, in the embodiments, filling, by using the molding material, the structure formed by the fan-out unit 31 and the first substrate 32 may be performed before the structure is connected to the another structure such as the substrate.

The foregoing is an implementation of the chip provided in this embodiment. In this implementation, the chip includes the fan-out unit 31, the first substrate 32, and the molding body 33. The first solder pads in the first solder pad array on the first substrate 32 are attached to the corresponding second pins 352 in the second pin arrays C2 on the different dies 341 and 342, to implement short-distance and high-density interconnection of the different dies. The molding body 33 is used to wrap the first pin 351, the second pin 352, and the first substrate 32, so that the fan-out unit 31 and the first substrate 32 are molded into an integral structure. In the integral structure, the bottoms of the first pins that are in the first pin array C1 on the die and that are electrically connected to the periphery of the chip are not wrapped by the molding body 33. In this way, the first pins may be directly electrically connected to the periphery of the chip. Therefore, according to the chip provided in this embodiment, a pin that is on the die and that is configured to electrically connect to the peripheral of the chip may be directly electrically connected to the peripheral of the chip, without using a substrate as an intermediary. An overall size of the chip provided in this embodiment mainly depends on a size of the fan-out unit. The overall size of the chip provided in this embodiment is smaller than that of a chip in the prior art, and a requirement on chip miniaturization can be met.

In addition, in this embodiment, a manner in which the dies 341 and 342 are interconnected through the first substrate 32 also facilitates the chip miniaturization.

Moreover, in this embodiment, the first substrate 32 may be independently manufactured, and does not need to be directly manufactured on the fan-out unit 31. Therefore, if a defect occurs in a manufacturing process of the first substrate 32, a qualified die is not discarded, thereby reducing packaging costs.

Furthermore, in this embodiment, a size of the first substrate 32 is sufficient provided that the substrate 32 can be attached to the second pin 352 on the die, and the size does not need to be greater than or equal to a sum of sizes of all the dies integrated together. Therefore, in this embodiment, materials consumed by the first substrate 32 can be reduced, and package costs can be greatly reduced. In addition, such a design is also conducive to the chip miniaturization.

In addition, in this embodiment, both a line width and a line distance of the first re-distribution layer on the first substrate 32 may reach 0.4 μm. Therefore, the line width and the line distance are relatively small, and a manufacturing process is relatively simple.

In an embodiment, the molding body 33 and the fan-out unit 31 may be of an integrally formed structure. In this case, the molding body 33 and the fan-out unit 31 may be obtained through compression molding in one time of molding process. In addition, in another embodiment, the molding body 33 and the fan-out unit 31 may alternatively be of split structures. In this case, the molding body 33 and the fan-out unit 31 are obtained through compression molding in different times of molding processes.

In an optional embodiment, to clearly understand a specific interconnection structure between the die 341 and the die 342 in this embodiment, an embodiment further provides an interconnection structure between the die 341 and the die 342. Details are shown in FIG. 6A and FIG. 6B.

In this optional embodiment, it is specified that the first re-distribution layer 321 includes three layers of re-distribution sublayers, which may be respectively a first re-distribution sublayer, a second re-distribution sublayer, and a third re-distribution sublayer. As shown in FIG. 6A and FIG. 6B, the first re-distribution sublayer and the third re-distribution sublayer are used to implement interconnection of the dies 341 and 342, and a plane in which the second re-distribution sublayer is located is used as a reference plane of the re-distribution sublayers that are used to implement interconnection of the dies. In this way, signal quality can be improved and crosstalk between signals can be reduced.

Figure 6A:
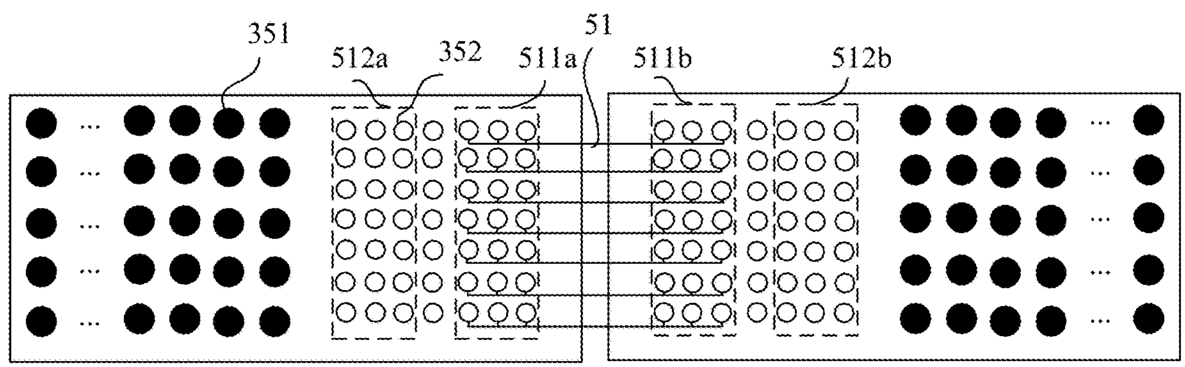
FIG. 6A is a schematic diagram of an interconnection structure between dies according to an embodiment.
Figure 6B:
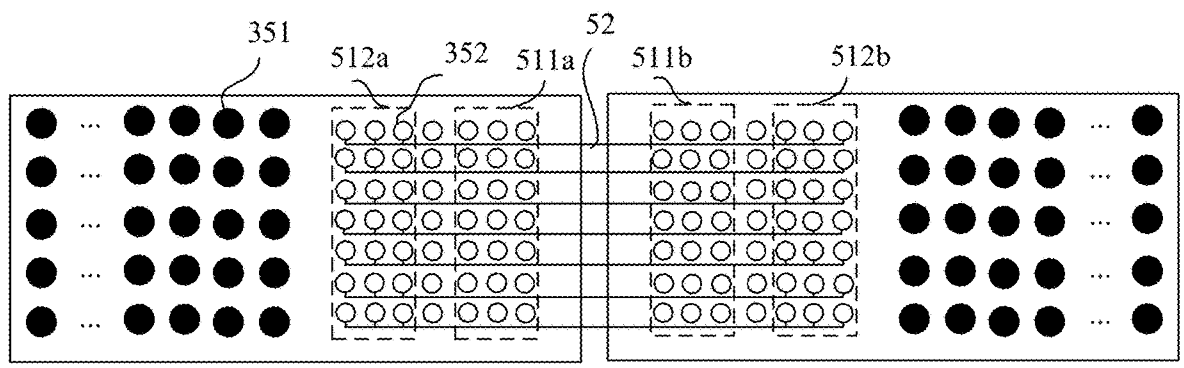
FIG. 6B is a schematic diagram of an interconnection structure between dies according to an embodiment.

In the interconnection structures shown in FIG. 6A and FIG. 6B, two interconnection structures are formed between the dies 341 and 342, and are respectively a first interconnection structure 51 and a second interconnection structure 52. The first interconnection structure 51 may be formed by the first re-distribution sublayer, and the second interconnection structure 52 may be formed by the third re-distribution sublayer.

As shown in FIG. 6A and FIG. 6B, the second pin array on the die 341 includes a first pin group 511*a* configured to form the first interconnection structure 51 and a second pin group 512*a* configured to form the second interconnection structure. The second pin array on the die 342 includes a first pin group 511*b* configured to form the first interconnection structure 51 and a second pin group 512*b* configured to form the second interconnection structure.

Figure 6C:
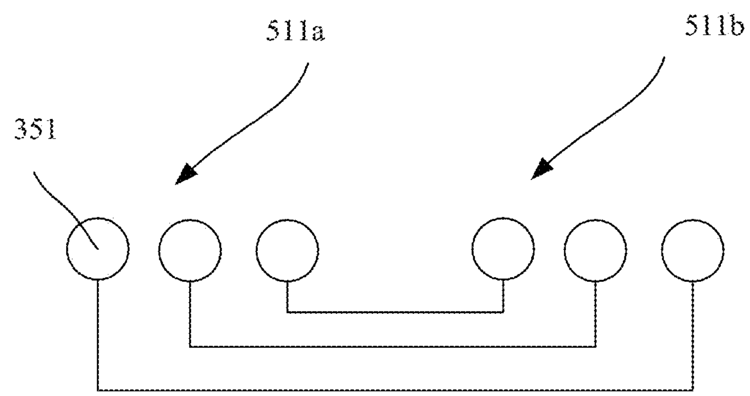
FIG. 6C is a schematic diagram of an interconnection structure between dies according to an embodiment.

In this embodiment, at least one interconnection structure may be formed between different dies, and each interconnection structure may include at least one interconnection line. When one interconnection structure includes a plurality of interconnection lines, the plurality of interconnection lines belonging to the same interconnection structure may have a same length or different lengths. In an optional embodiment, to improve signal transmission quality, all interconnection lines in a same interconnection structure have an equal length. For example, in FIG. 6A, it is specified that electrical connection structure columns in a same electrical connection structure group are sequentially named as a column 1, a column 2, and a column 3 in a sequence from left to right, and electrical connection structure rows are sequentially named as a row 1, a row 2, . . . , until a row 7 in a sequence from up to down. In the first interconnection structure 51, a manner of connecting electrical connection structures in a row 1 in the first pin group 511*a* is shown in FIG. 6C. A solder joint in the row 1 and a column 1 in the first pin group 511*a* is connected to a solder joint in a row 1 and a column 1 in the first pin group 511*b*, a solder joint in the row 1 and a column 2 in the first pin group 511*a* is connected to a solder joint in the row 1 and a column 2 in the first pin group 511*b*, and a solder joint in the row 1 and a column 3 in the first pin group 511*a* is connected to a solder joint in the row 1 and a column 3 in the first pin group 511*b*. Electrical connection structures in other rows are connected in a manner the same as a manner used for the electrical connection structures in the row 1. Details are not further described herein again.

It can be noted that, in this embodiment, as required by a package structure design, the first re-distribution layer 321 may be a single-layer distribution layer, or may be a multilayer distribution layer. When the first re-distribution layer includes a plurality of layers of first re-distribution sublayers, to improve signal quality and reduce crosstalk between signals, a plane in which any layer of first re-distribution sublayer is located is set as a reference plane of another first re-distribution sublayer, and the another first re-distribution sublayer is used to form an interconnection structure between different dies. In other words, when the first re-distribution layer 321 includes a plurality of layers of distribution layers, the plurality of layers of distribution layers include a reference layer and a line layer, where a plane in which the reference layer is located is used as a reference plane of the line layer. The line layer is used to form an interconnection structure between different dies.

In this embodiment, when the first re-distribution layer includes a plurality of layers of first re-distribution sublayers, an insulation dielectric layer may be disposed between different first re-distribution sublayers. The insulation dielectric layer may be an organic dielectric layer, for example, may be a dielectric layer made of a polymer material. The polymer material may be PI, PBO, or an epoxy resin-based polymer. In addition, a minimum size of a through via or a through via area on the insulation dielectric layer may reach 5 um/10 um or less.

In this embodiment, the first re-distribution layer 321 on the first substrate 32 and the first solder pad 322 in the first solder pad array each form an interconnection structure with the second pin 352 in the second pin array C2 on the dies 341 and 342. In this way, the die 341 and the die 342 are interconnected. In the interconnection structure, the first re-distribution layer 321 on the first substrate 32 serves as a bridge connecting the die 341 and the die 342. Therefore, the first substrate 32 may be referred to as a bridge substrate.

In an optional embodiment, a cross-sectional size of the first substrate 32 is sufficient provided that the first substrate 32 can be attached to the second pin arrays on the dies 341 and 342, and the cross-sectional size does not need to be greater than a total size of a plurality of to-be-integrated dies. Therefore, the chip provided in this embodiment consumes fewer materials.

In another optional embodiment, to ensure a performance requirement of high-density interconnection of dies, a distance between the dies needs to be as small as possible if a process condition allows. For example, the distance between the dies may be 50 μm or even less. In the fan-out unit 31, side faces of the dies 341 and 342 are wrapped by molding compound. In addition, in this embodiment, an epitaxial width of the molding compound at outermost sides of the die 341 and the die 342 may be flexibly designed, and may be generally less than 5 mm In other words, the molding compound at an outermost side of the fan-out unit 31 may extend epitaxially by a specific width in a thickness direction of the die as required, so that design of the substrate can be simplified and a quantity of layers of the substrate can be reduced.

In addition, in this embodiment, the dies 341 and 342 may be passive dies or may be functional dies. For example, the dies 341 and 342 may be homogeneous or heterogeneous. For example, the die may be integrated by an analog die and a digital die, integrated by dies of different process nodes, integrated by dies of different functions, or integrated by different quantities of dies after the dies are stacked. In addition, the dies 341 and 342 may be stacked dies.

It can be noted that the first pin 351 is configured to lead out an I/O pin on a die to the periphery of the chip, and the second pin 352 is configured to implement interconnection of different dies. Therefore, to facilitate connection between a pin and a solder pad, in still another optional embodiment, a size of the first pin 351 is greater than a size of the second pin 352. For example, a height of the first pin 351 is greater than a height of the second pin 352, and a cross-sectional size of the first pin 351 is also greater than a cross-sectional size of the second pin 352.

In an optional embodiment, in the first pin array, a distance between two adjacent first pins 351 is a first distance d1, and in the second pin array, a distance between two adjacent second pins 352 is a second distance d2. The first distance d1 may be greater than the second distance d2. This better facilitates connection between a pin and a corresponding solder pad.

It can be noted that in this embodiment, the first solder pad in the first solder pad array is used to connect to the second pin in the second pin array. Therefore, in an optional embodiment, a cross-sectional size of a single first solder pad may be the same as a cross-sectional size of a single second pin.

For example, the first pin 351 may be a Cu pillar (Cu pillar), and the second pin 352 may be a solder bump (solder bump).

In this embodiment, the first solder pad 322 may be an electrical connection structure in various forms, and may be, for example, a solder bump, a protruding metal interface, or a flat metal plate. The solder bump may be a solder block.

In addition, as extension of this embodiment, the first pin 351 and the second pin 352 are not limited to specific pin structures in the foregoing examples. For example, the first pin 351 is not limited to the Cu pillar, and the second pin 352 is not limited to the solder bump. For example, in this embodiment, the first pin 351 may be formed by at least one of the Cu pillar or the solder bump. Similarly, the second pin 352 may be formed by at least one of the Cu pillar or the solder bump.

Figure 7:
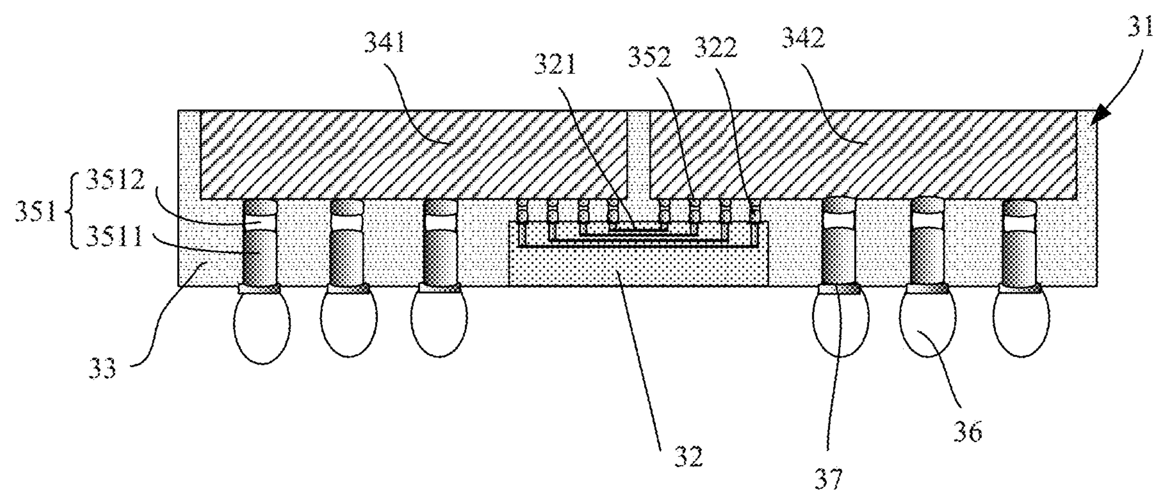
FIG. 7 is a schematic sectional view of another chip according to an embodiment.

When the first pin 351 is of a structure formed by the Cu pillar and the solder bump, a schematic sectional view of a corresponding chip is shown in FIG. 7. It can be noted that a chip structure shown in FIG. 7 is the same as the structure of the chip shown in FIG. 4 except a structure of the first pin 351. In the chip structure shown in FIG. 7, each first pin 351 includes a Cu pillar part 3511 and a solder bump part 3512 that are connected to each other. It can be noted that, because the first pin 351 has a relatively large size, the first pin 351 uses a structure formed by the Cu pillar part 3511 and the solder bump part 3512 that are connected to each other, to facilitate manufacturing of the first pin 351.

Figure 8:
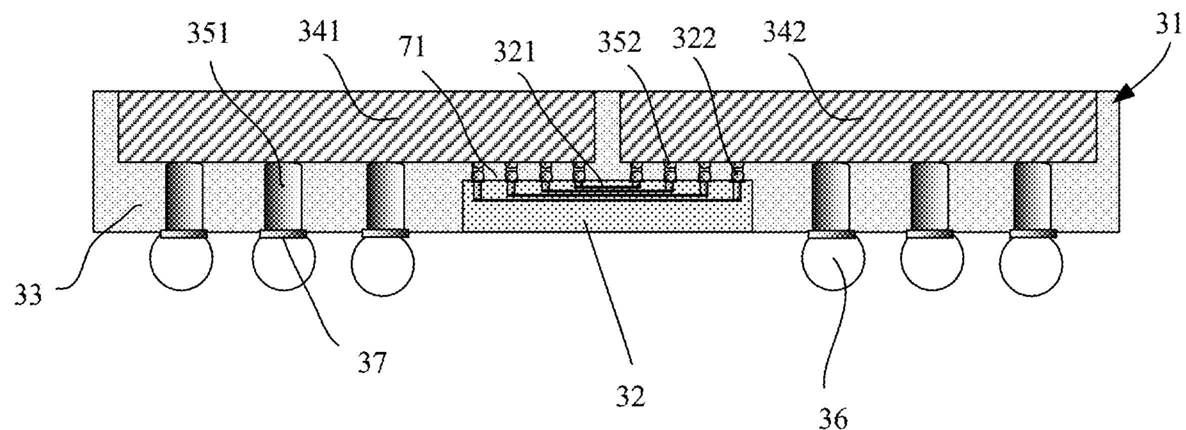
FIG. 8 is a schematic sectional view of still another chip according to an embodiment.

In addition, in still another optional embodiment, because a gap between the first solder pads in the first solder pad array is relatively small, if a molding compound is used to fill the gap according to a molding process, a poor filling effect of the gap may be caused. To improve the filling effect of the gap between the first solder pads in the first solder pad array, and further improve reliability of the chip, as shown in FIG. 8, in this embodiment, an underfill 71 is filled in a gap between different first solder pads 322. It can be noted that a package structure shown in FIG. 8 is basically the same as the chip structure shown in FIG. 4, and a difference only lies in that the chip structure shown in FIG. 8 includes the underfill 71 filled in the gap between the first solder pads 322 in the first solder pad array.

In still another optional embodiment, a material for manufacturing the first substrate 32 may be any dielectric material such as a silicon-based material, a resin material, or a glass material. For example, the first substrate 32 may be a silicon substrate. In addition, the first substrate 32 may be a substrate processed by using a fan-out re-distribution layer technology. In this example, the first substrate 32 may be usually manufactured by using the resin material and an electrocoppering technology. In addition, the first substrate 32 may alternatively be a glass substrate on which an interconnection circuit is made on a surface. The interconnection circuit may be obtained by processing a glass material surface through etching and electroplating processes. It can be noted that, in this embodiment, both the line width and the line distance of the first re-distribution layer on the first substrate 32 may reach 0.4 μm.

Figure 9:
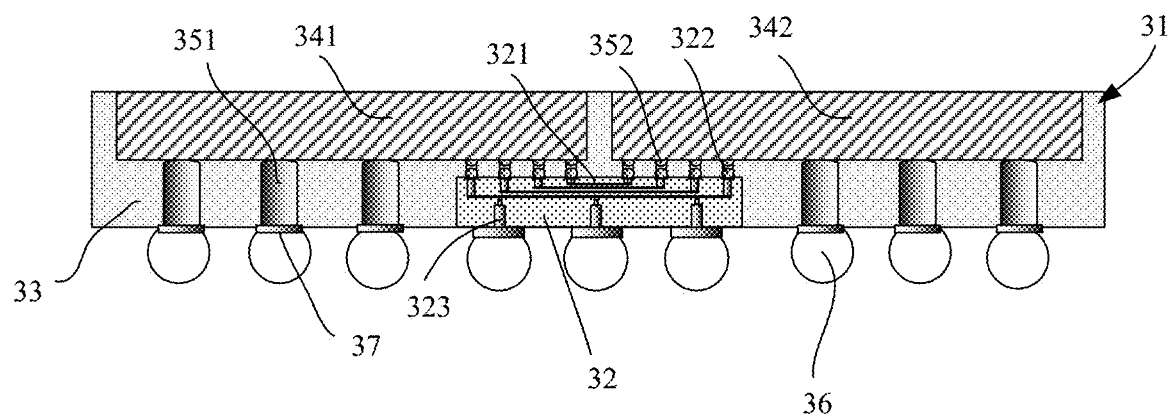
FIG. 9 is a schematic sectional view of still another chip according to an embodiment.

It can be noted that, in the chip described in the foregoing embodiments, the first substrate 32 is used to interconnect dies, and only a re-distribution layer and an electrical connection structure used for interconnection of dies are disposed on the first substrate 32. For example, as extension of this embodiment, to supply power to the first re-distribution layer 321 on the first substrate 32, in a package structure shown in FIG. 9, a through via 323 electrically connected to the first re-distribution layer 321 may be further disposed inside the first substrate 32. The through via 323 extends to a second surface of the first substrate 32. The second surface of the first substrate 32 is opposite to the first surface of the first substrate 32.

The through via 323 may be electrically connected to a circuit on the periphery of the chip. In this way, electric energy on the periphery of the chip can be transmitted to the first re-distribution layer 321 through the through via 323.

In another optional embodiment, a logical chip may be further disposed on the first substrate 32. In a further example, a logical layer (not shown in FIG. 9) may be disposed inside the logical chip, and the logical layer is electrically connected to the through via 323. In this way, signal transmission between the logical layer and the outside can be implemented through the through via 323. In other words, the through via 323 can lead out a signal on the logical layer to the second surface of the first substrate 32, for signal transmission with the outside.

It can be noted that, based on the chip in the foregoing embodiments, the first pins 351 in the first pin array on the first surface of the die leads I/O pins on the die to a peripheral area of the chip. In this way, chip miniaturization can be implemented, and a requirement on miniaturization of a terminal consumer chip can be met.

In addition, as pin density of the die increases, a pin distance on the die becomes increasingly small, and consequently, it is difficult for a pin on the die to be directly electrically connected to a peripheral circuit on the chip. That is, for a chip structure in which pins on a die are directly connected to the peripheral circuit on the chip, an electrical connection between the pins on the die and the peripheral circuit of the chip is limited by sizes and an arrangement of the pins on the die.

Based on this, to facilitate the electrical connection between the pins on the die and the peripheral circuit on the chip, an electrical connection between the chip and the peripheral circuit of the chip is not limited to the sizes and the arrangement of the pins on the die. Based on any one of the foregoing embodiments, in this embodiment, a substrate that is used to directly electrically connect to the pins on the die may be further disposed below the molding body. For details, refer to FIG. 10A.

Figure 10A:
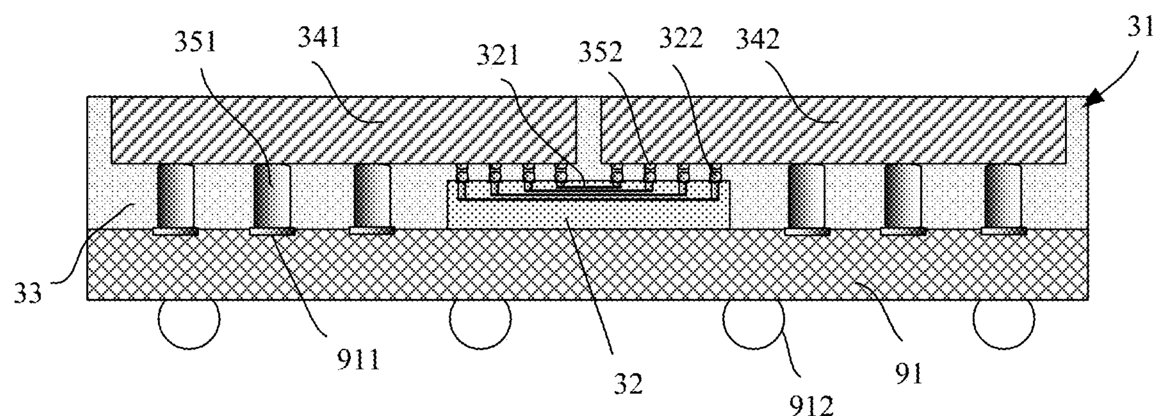
FIG. 10A is a schematic sectional view of still another chip according to an embodiment.

It can be noted that, in an example, a chip shown in FIG. 10A is obtained by improving the chip shown in FIG. 4.

As shown in FIG. 10A, in addition to the components described in the foregoing implementations, another implementation of the chip provided in this embodiment may further include:

a second substrate 91, where the second substrate 91 is directly disposed below the molding body 33 according to a distribution layer build-up process.

Figure 10B:
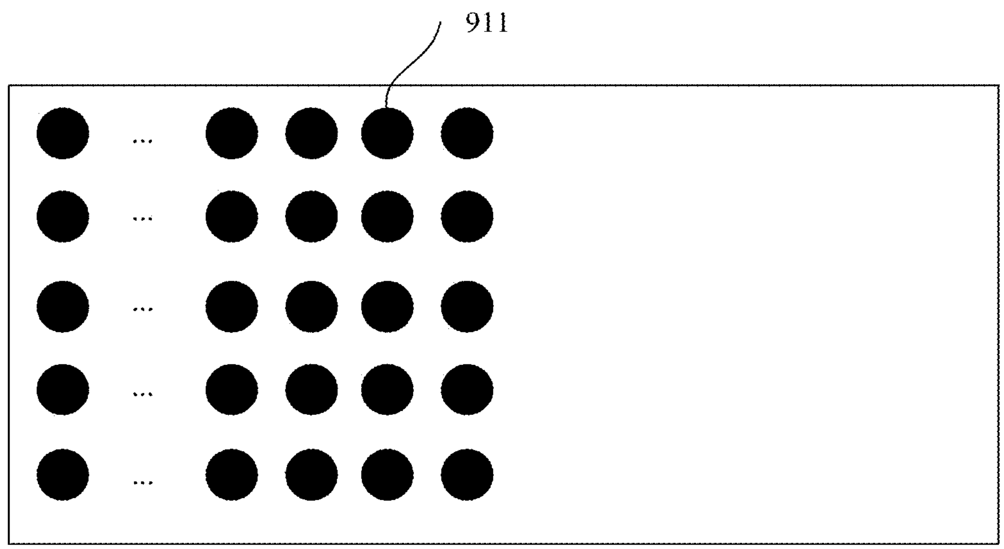
FIG. 10B is a schematic structural diagram of a first surface of a second substrate according to an embodiment.

A second re-distribution layer (not shown in the figure) is disposed on the second substrate 91, and the second substrate 91 includes a first surface and a second surface that are opposite to each other. To clearly understand a first surface structure of the second substrate 91, an embodiment further provides a schematic diagram of the first surface structure of the second substrate 91. As shown in FIG. 10B, a second solder pad array electrically connected to the second re-distribution layer is disposed on the first surface of the second substrate 91, and the second solder pad array includes a plurality of second solder pads 911. The second solder pad 911 may be a metal bump or a metal solder pad, or may be a protruding metal interface. The metal bump may be a solder block.

It can be noted that, in this embodiment, the second re-distribution layer may include a plurality of layers of re-distribution layers, and the plurality of layers of re-distribution layers may be evenly distributed in the entire thickness of the second substrate 91. In this way, the second re-distribution layer may be distributed not only on the first surface of the second substrate 91, but also inside the second substrate 91.

In addition, a third solder pad array is disposed on the second surface of the second substrate 91, and the third solder pad array includes a plurality of third solder pads 912. In this embodiment, the third solder pad 912 is used to implement an electrical connection between the chip and a peripheral circuit of the chip. In an example, the third solder pad 912 may be a metal solder ball.

In this embodiment, the second solder pad array is opposite to the first pin array, and each second solder pad 912 in the second solder pad array is electrically connected to a corresponding first pin 351 in the first pin array.

In the embodiment of the chip shown in FIG. 10A, the first pins 351 in the first pin arrays on the dies 341 and 342 are electrically connected to the corresponding second solder pads in the second solder pad array on the second substrate 91, and each third solder pad in the third solder pad array on the second substrate 91 is electrically connected to the peripheral circuit of the chip. In this way, the first pins 351 on the dies 341 and 342 are electrically connected to the peripheral circuit of the chip by using the second substrate 91. Because the second substrate 91 can provide larger line design space, density of the third solder pads 912 on the second substrate 91 may be less than density of the first pins 351 on the die. Therefore, compared with the first pins 351 on the dies 341 and 342, the third solder pads 912 on the second substrate 91 may be relatively easily electrically connected to the peripheral circuit of the chip through a soldering process. Therefore, even if the chip provided in this embodiment includes a die with high pin density, the electrical connection between the die and the peripheral circuit of the chip can be easily implemented. Therefore, in the chip shown in FIG. 10A, the electrical connection between the chip and the peripheral circuit of the chip is no longer limited by sizes and an arrangement of pins on the die. Therefore, based on the chip structure, limitations caused by the arrangement of the pins on the die on the electrical connection between the chip and the peripheral circuit of the chip can be reduced.

In still another optional embodiment, in the chip structure shown in FIG. 10A, a first substrate 32 may be in contact with the second substrate 91. For example, as extension of this embodiment, the first substrate 32 may not be in contact with the second substrate 91, and there is a gap between the first substrate 32 and the second substrate 91. In other words, the first substrate 32 is suspended above the second substrate 91. Further, in this embodiment, provided that the first substrate 32 can be placed between a fan-out unit 31 and the second substrate 91, the thickness of the first substrate 32 is not limited.

In addition, as shown in FIG. 10A, a cross-sectional size of the second substrate 91 may be equivalent to a cross-sectional size of the fan-out unit 31. In this way, package structure miniaturization can be implemented, and a requirement on miniaturization of a terminal consumer chip can be met.

In addition, the second substrate 91 may be directly manufactured on a surface that is of a molding body 33 and that is away from the fan-out unit 31. For example, a dielectric layer, such as a PI/PBO material, is coated on the surface that is of the molding body 33 and that is away from the fan-out unit 31, and then a copper conductive line is grown on a surface of the dielectric layer and stacked layer by layer until the second re-distribution layer is manufactured. When the second re-distribution layer is manufactured, the second solder pad array corresponding to the first pin array is manufactured at a position opposite to the first pin array. After the second re-distribution layer and the second solder pad array are manufactured, a dielectric layer is continued to be coated, and then the third solder pad array including the plurality of third solder pads 912 is manufactured on a surface of the dielectric layer.

In the chip shown in FIG. 10A, the second substrate 91 is used to lead out an I/O pin on a die to a peripheral area of the chip, to implement an electrical connection between the chip and a PCB board. The second substrate 91 can provide relatively large line design space, to facilitate the electrical connection between the chip and the peripheral circuit of the chip.

In addition, to further increase routing resources of the chip and a quantity of pins of the package structure, improve integrity of a packaged power supply, and improve board-level reliability of the chip, an embodiment further provides another implementation of the chip.

Figure 11:
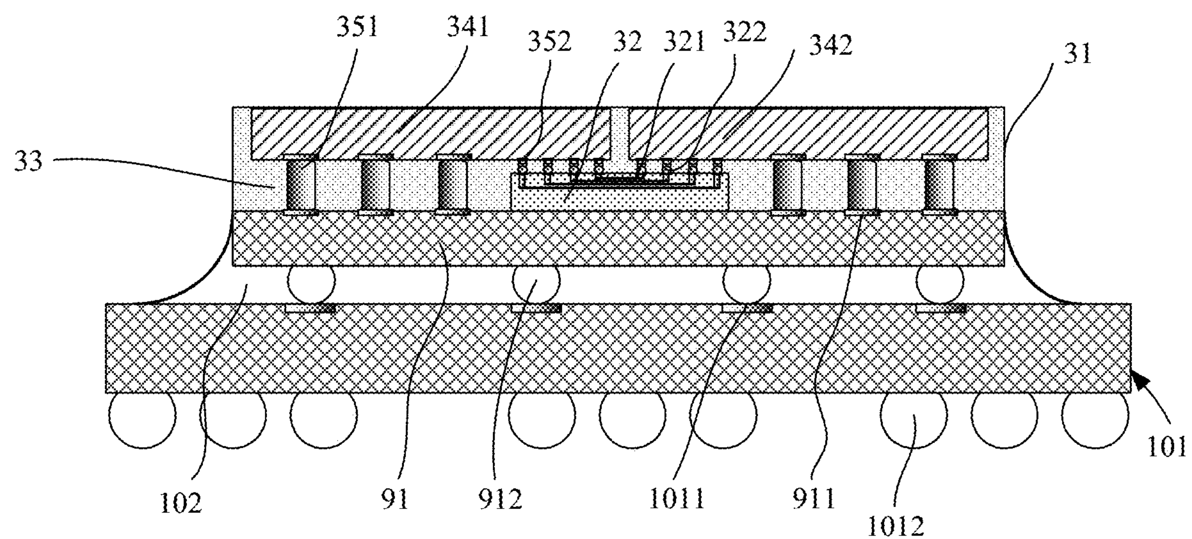
FIG. 11 is a schematic sectional view and a top view of still another chip according to an embodiment.
Figure 11:
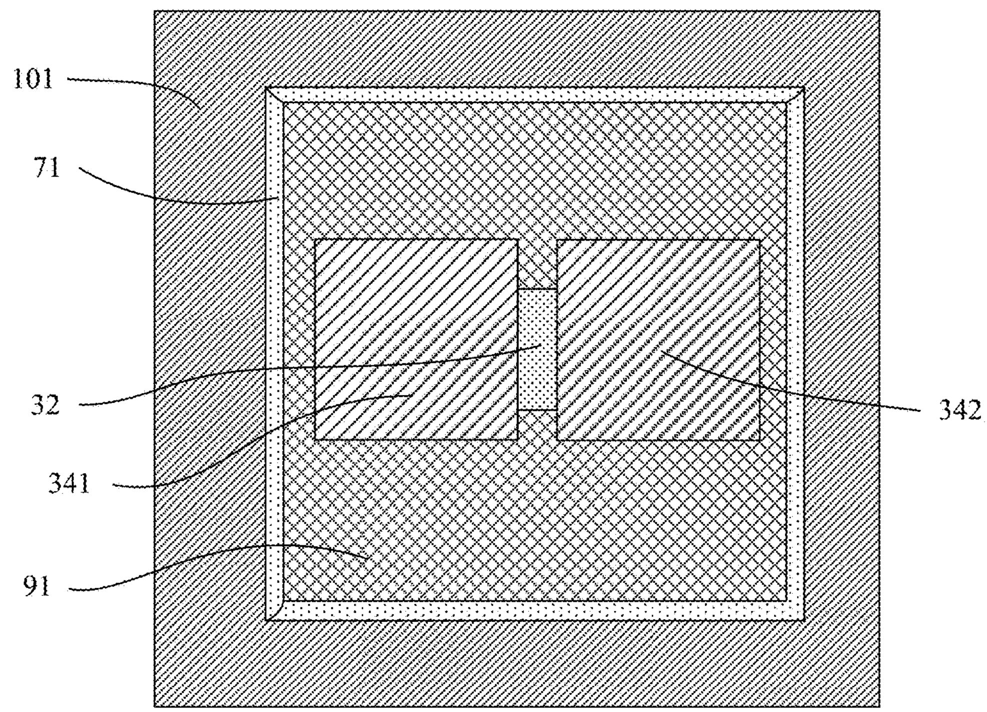

Referring to FIG. 11 and FIG. 11', FIG. 11 is a schematic sectional view of another chip according to this embodiment. FIG. 11' is a top view of another chip structure according to this embodiment.

It can be noted that, in an example, the chip structures shown in FIG. 11 and FIG. 11' are obtained by improving the chip structure shown in FIG. 10A.

As shown in FIG. 11 and FIG. 11', in addition to the components described in the foregoing implementations, another implementation of the chip structure provided in this embodiment may further include:

a third substrate 101 disposed below the second substrate 91, where the third substrate 101 includes a first surface and a second surface that are opposite to each other, a fourth solder pad array is disposed on the first surface of the third substrate 101, and a fifth solder pad array is disposed on the second surface of the third substrate 101. The fourth solder pad array includes a plurality of fourth solder pads 1011, and the fifth solder pad array includes a plurality of fifth solder pads 1012.

The fourth solder pad array is opposite to the third solder pad array, and each fourth solder pad 1011 in the fourth solder pad array is electrically connected to a corresponding third solder pad 912 in the third solder pad array.

The fifth solder pad 1012 in the fifth solder pad array is used to implement signal transmission between the chip and a periphery of the chip.

In an example, the fourth solder pad 1011 may be a metal bump, and the fifth solder pad 1012 may be a metal solder ball. In another example, the metal solder ball may be a solder ball, and is connected to a PCB board in a soldering manner. In another example, the fifth solder pad 1012 may be a metal solder plate, and is connected to a PCB board in a peripheral area in a socket (socket) manner.

It can be noted that in this embodiment, a cross-sectional size of the third substrate 101 may be greater than a cross-sectional size of the fan-out unit 31. In another example, the cross-sectional size of the third substrate 101 may be equal to the cross-sectional size of the fan-out unit 31.

In the chip structures shown in FIG. 11 and FIG. 11', I/O pins on a die are led out to the peripheral area of the chip by using the second substrate 91 and the third substrate 101 through routing. In this implementation, the I/O pins on the die are led out by using the two substrates, so that routing resources of the chip structure and a quantity of packaged pins are increased, integrity of a packaged power supply is improved, and board-level reliability of the chip structure is improved.

In an optional embodiment, to relieve stress between the first pin 351 and the second substrate 91, and further improve reliability of the entire chip structure, the chip structure shown in FIG. 11 may further include an underfill 102 filled between the second substrate 91 and the third substrate 101.

In addition, to improve heat dissipation performance of the chip structure, this embodiment further provides still another implementation of the chip structure.

Figure 12:
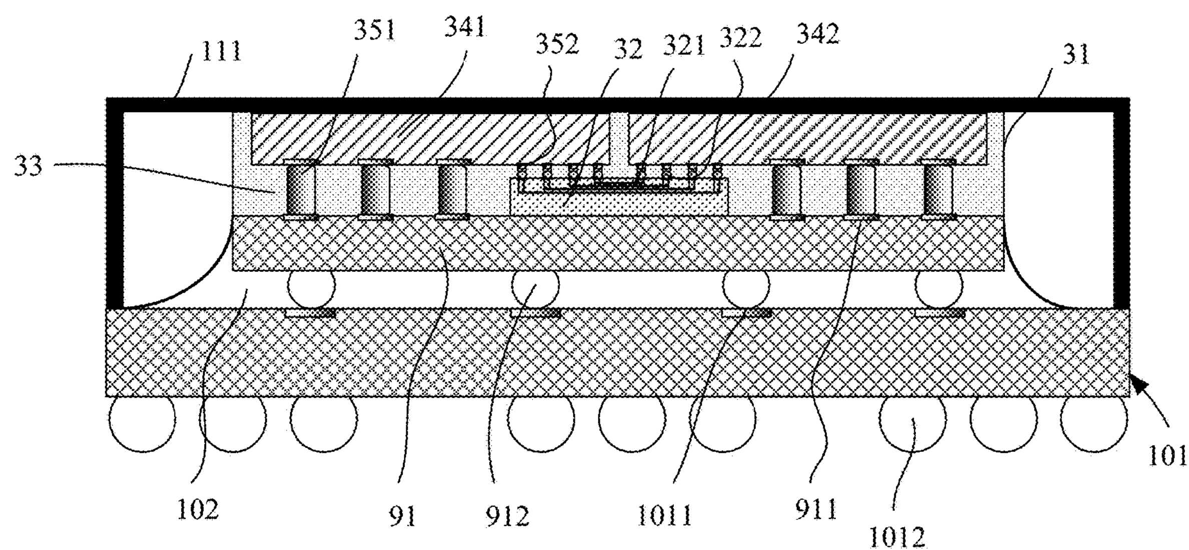
FIG. 12 is a schematic sectional view of still another chip according to an embodiment.

The chip structure shown in FIG. 12 is obtained by improving the chip structure shown in FIG. 11. Therefore, in addition to the components of the package structure shown in FIG. 11, a package structure shown in FIG. 12 may further include:

heat sinks 111 disposed on the second surfaces of the dies 341 and 342, where the second surfaces of the dies 341 and 342 are opposite to the first surfaces of the dies 341 and 342.

In an example, the heat sinks 111 may be bonded to the second surfaces of the dies 341 and 342 by using a thermal adhesive, so that a desirable heat dissipation approach can be provided for a chip with high power consumption.

In addition, to facilitate dissipation of heat generated when the dies 341 and 342 work, in an optional embodiment, a second surface of each die is not wrapped by a molding compound, and if a heat dissipation requirement is met, the second surface of each die may be wrapped by the molding compound. It can be noted that if the die has relatively low power and generates less heat, the second surface of each die may be wrapped by the molding compound.

In addition, in another optional embodiment, when the cross-sectional size of the third substrate 101 may be greater than the cross-sectional size of the fan-out unit, to control warp of the package structure and reliability of the structure, the heat sink 111 may be connected to the third substrate 101. Further, the heat sink 111 may be bonded to a front face of the third substrate 101 by using an adhesive.

In an example, the heat sink 111 may have an integral structure, or may have a split structure. When the heat sink 111 has an integral structure, the heat sink 111 may have a cap-shaped structure or a curved structure. When the heat sink 111 has a cap-shaped structure, the heat sink 111 masks the fan-out unit 31, and an edge of the heat sink 111 is fastened on the third substrate 101.

It can be noted that when the heat sink 111 is fastened on the third substrate 101, warp of the entire chip structure and reliability of the chip can be controlled.

Figure 13:
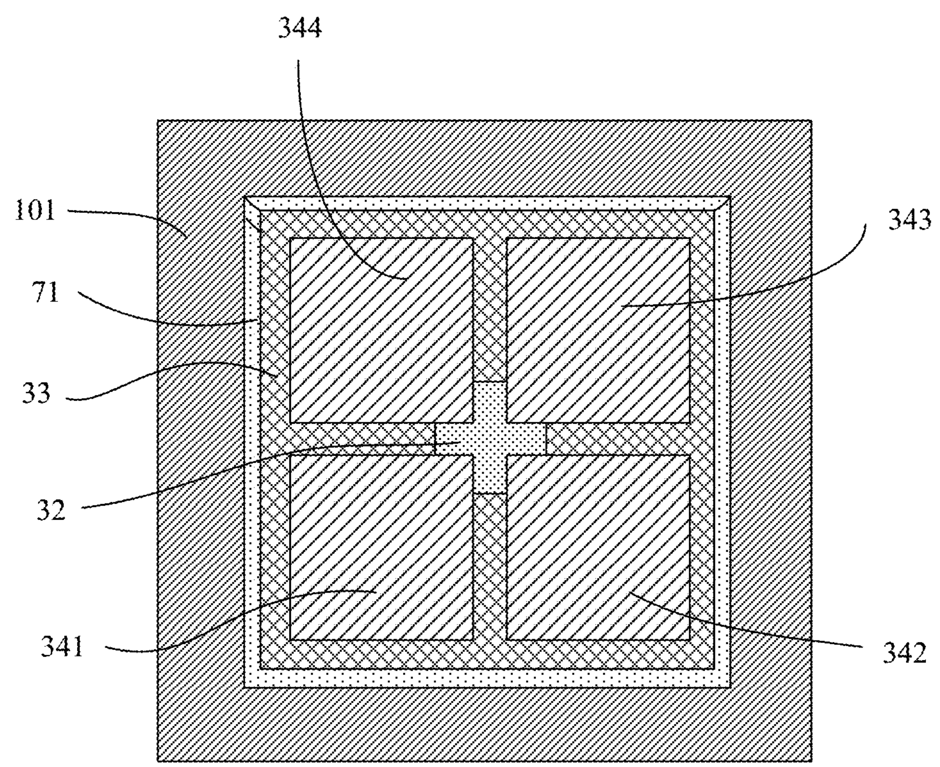
FIG. 13 is a top view of still another chip according to an embodiment.

The implementation of the foregoing chip is described by using an example in which two dies are used as to-be-integrated dies. Essentially, the chip provided in the embodiments is not limited to being in a form in which two dies are interconnected and may be in a form in which three or more dies are interconnected. FIG. 13 is a top view of a fan-out wafer-level package structure integrated by four dies. As shown in FIG. 13, the integrated four dies 341 to 344 are interconnected through a first substrate 32.

The foregoing is an implementation of the chip structure provided in the embodiments. Based on the implementation of the chip structure, an embodiment further provides an implementation of a chip packaging method. For details, refer to the following embodiments.

Figure 14:
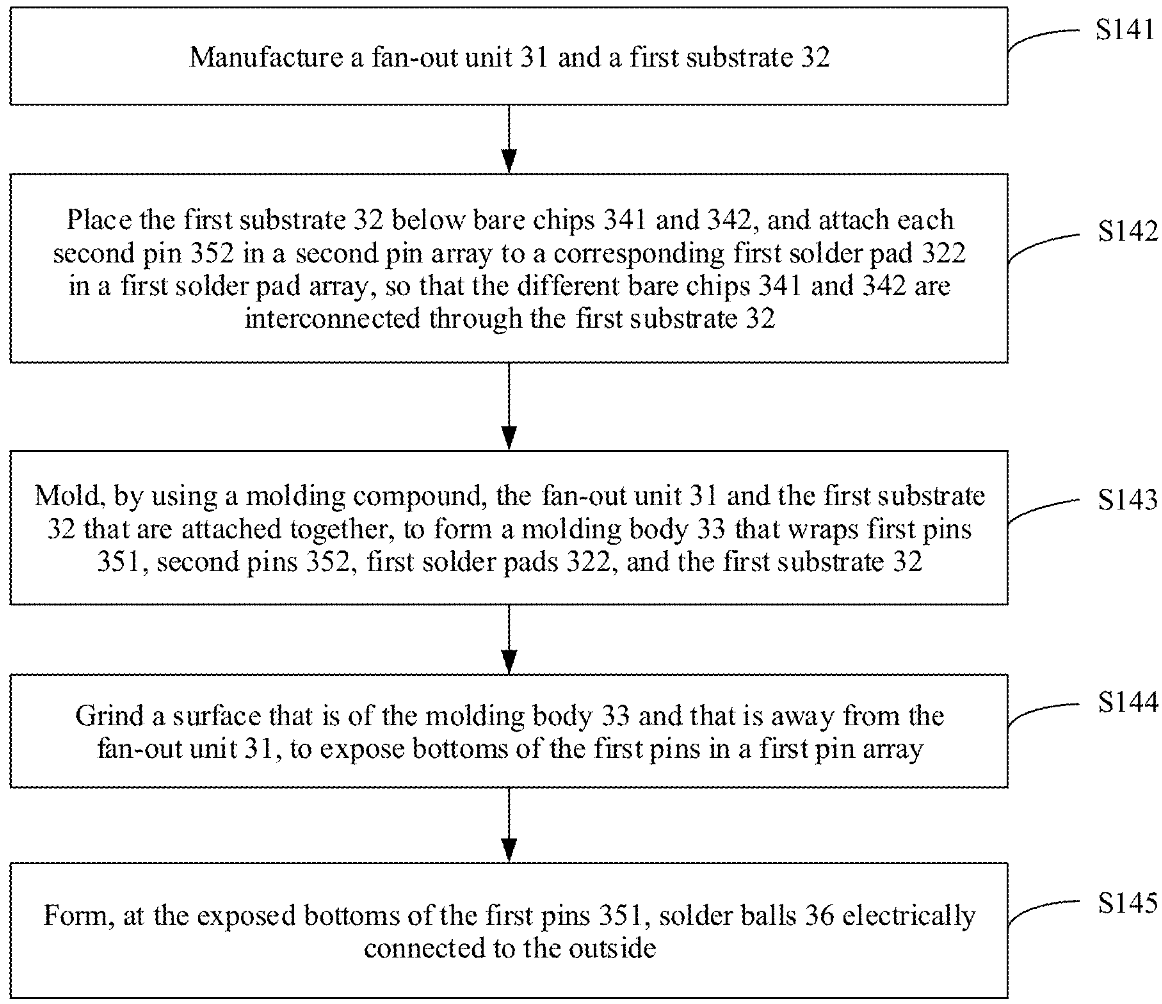
FIG. 14 is a schematic flowchart of a chip packaging method according to an embodiment.
Figure 15B:
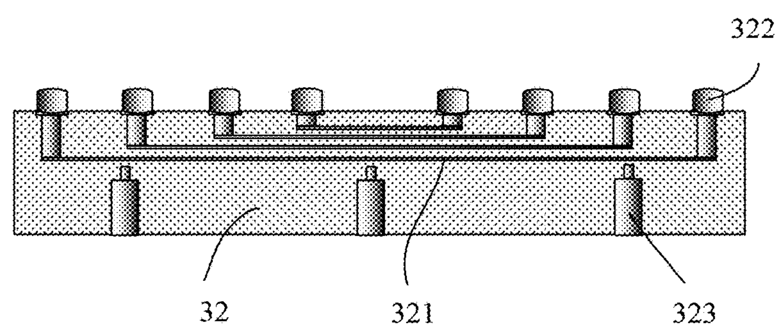
FIG. 15B is a schematic structural diagram of one of a series of corresponding manufacturing processes of a chip packaging method according to an embodiment.
Figure 15B:
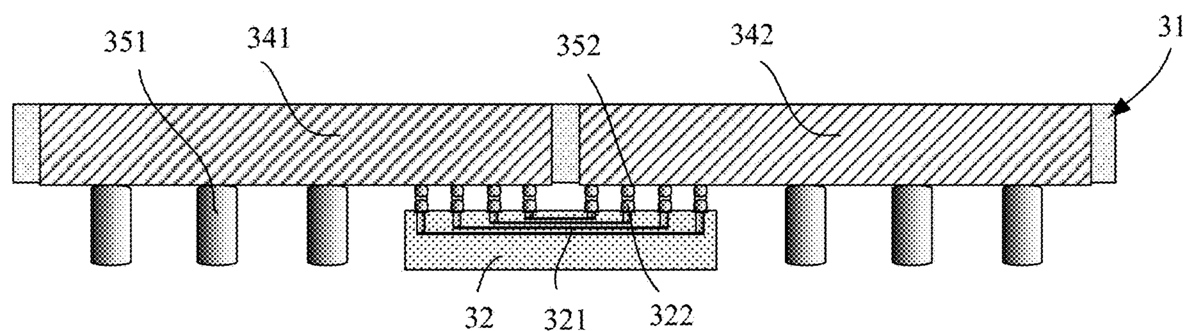
Figure 15C:
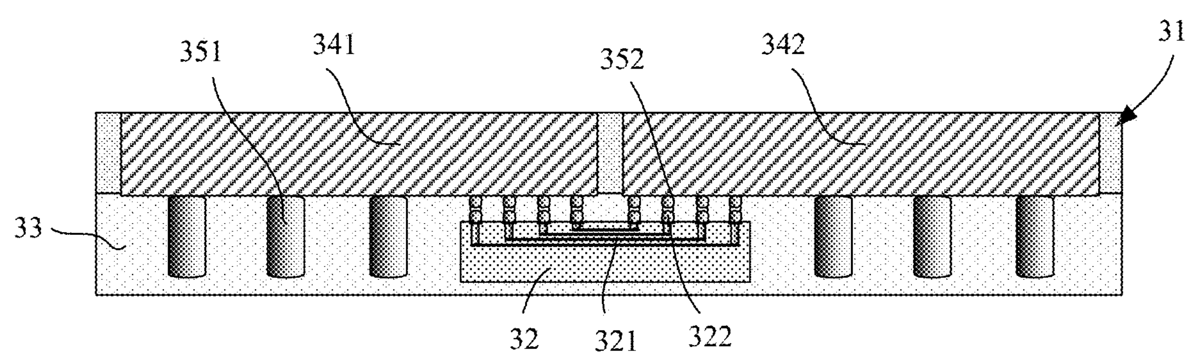
FIG. 15C is a schematic structural diagram of one of a series of corresponding manufacturing processes of a chip packaging method according to an embodiment.
Figure 15D:
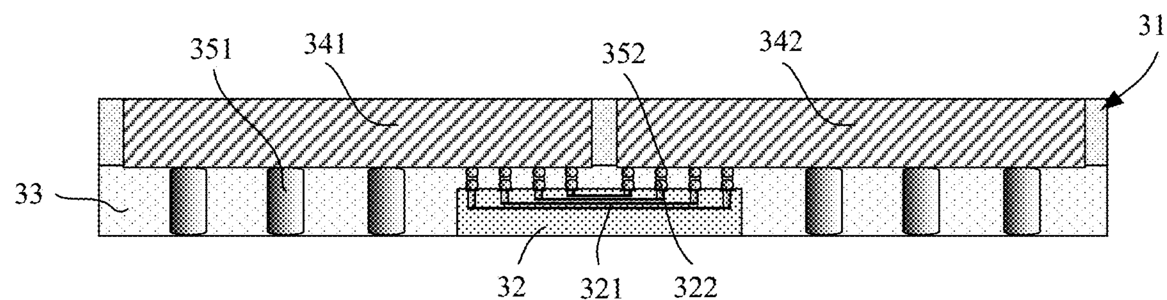
FIG. 15D is a schematic structural diagram of one of a series of corresponding manufacturing processes of a chip packaging method according to an embodiment.

Referring to FIG. 14 to FIG. 15D, a packaging method for a fan-out wafer-level package structure according to an embodiment includes the following steps.

S141: Separately manufacture a fan-out unit 31 and a first substrate 32.

In an example, an implementation of manufacturing the fan-out unit 31 may include the following steps:

A1: Thin an original wafer of a die according to a design requirement, and then cut the thinned wafer into single dies.

A first pin window array and a second pin window array are disposed on a first surface of each die. The first pin window array includes a plurality of first pin windows spaced by a first distance d1, and the second pin window array includes a plurality of second pin windows spaced by a second distance d2. A size of the first pin window is greater than a size of the second pin window, and the first distance d1 is greater than the second distance d2.

A2: Arrange a plurality of to-be-integrated dies 341 and 342 according to preset positions and place the dies 341 and 342 on a temporary carrier 140.

As shown in FIG. 15A1, according to a design requirement, the plurality of to-be-integrated dies 341 and 342 are arranged according to the preset positions and placed on the temporary carrier 140.

It can be noted that in this embodiment, a size of the temporary carrier 140 may be the same as a size of the original wafer. The temporary carrier 140 may be a film material layer, and the film material layer may be a film made of a resin-type material.

To ensure a performance requirement on high-density interconnection of dies, a distance between the dies needs to be as small as possible on a premise that a process condition allows. For example, the distance between the dies may be 50 μm or even less. Side faces of the dies 341 and 342 are wrapped by a molding compound. In addition, in this embodiment, an epitaxial width of the molding compound at outermost sides of the die 341 and the die 342 may be flexibly designed, and may be generally less than 5 mm. In other words, the molding compound at an outermost side of the fan-out unit 31 may extend epitaxially by a specific width in a thickness direction of the die, so that design of the substrate can be simplified and a quantity of layers of the substrate can be reduced.

A3: Mold, by using a molding compound, the plurality of dies 341 and 342 placed on the temporary carrier 140, to form the fan-out unit 31.

It can be noted that, in this example, after the molding is completed, the plurality of dies molded together are taken out from the temporary carrier, and the plurality of dies molded together form the fan-out unit. The formed fan-out unit 31 is shown in FIG. 15A2. In the fan-out unit 31, a side face of each die is wrapped by the molding compound 141. A front face of each die is not wrapped by the molding compound, that is, the front face of each die is exposed to the outside. In this way, the first pin window array and the second pin window array of each die are exposed to the outside.

A4: Form a first pin 351 in each first pin window in the first pin window array on each die, to form a first pin array C1, and form a second pin 352 in the second pin window on each die, to form a second pin array C2.

As shown in FIG. 15A3, the first pin 351 is formed in each first pin window in the first pin window array on each die, to form the first pin array C1, and the second pin 352 is formed in the second pin window on each die, to form the second pin array C2.

In an example, the first pin 351 may be a Cu pillar, and the second pin 352 may be a solder bump.

It can be noted that, before the first pin 351 is formed in each first pin window and before the second pin 352 is formed in each second pin window, under bump metallization further needs to be formed on a surface of each first pin window and a surface of each second pin window.

The following describes an implementation of manufacturing the first substrate 32. It can be noted that the first substrate 32 may be provided with a through via for signal transmission with the outside, or may not be provided with a through via for signal transmission with the outside. The following separately describes implementations of the first substrate 32 in the two cases.

First, the implementation of the first substrate 32 not provided with a through via for signal transmission with the outside is described. In an example, the implementation of manufacturing the first substrate 32 may include the following steps.

B1: Divide a surface of an original wafer into a first area and a second area according to a design requirement of a package structure.

B2: Manufacture a first re-distribution layer 321 in the first area of the original wafer, then manufacture each piece of under bump metallization in the second area of the original wafer, and manufacture a first solder pad 322 above each piece of under bump metallization, to form a first solder pad array.

In an example, each piece of under bump metallization may be manufactured in the second area in a manner of electroplating or solder ball attachment.

In addition, the first solder pad 322 may be a Cu pillar, or may be a metal bump.

B3: Cut, into single first substrates 32, the wafer on which the first re-distribution layer 321 and the first solder pad 322 are manufactured.

In this case, a schematic sectional structural view of the formed single first substrate 32 is shown in FIG. 15A4.

The following describes the implementation of the first substrate 32 provided with a through via for signal transmission with the outside. In this case, the implementation of manufacturing the first substrate 32 may include the following steps B'1: Divide a front face of an original wafer into a first area and a second area according to a design requirement of a package structure.

B'2: Manufacture a first re-distribution layer 321 in the first area of the original wafer, then manufacture each piece of under bump metallization in the second area of the original wafer, and manufacture a first solder pad 322 above each piece of under bump metallization, to form a first solder pad array.

In an example, each piece of under bump metallization may be manufactured in the second area in a manner of electroplating or solder ball attachment.

In addition, the first solder pad 322 may be a Cu pillar, or may be a solder bump.

B'3: Provide a through via inside the original wafer, where the through via is electrically connected to the first re-distribution layer 321.

It can be noted that the through via may be provided inside the original wafer through a TSV process.

B'4: Manufacture a metal solder pad electrically connected to the through via on a back of the original wafer.

B'4: Cut, into single first substrates 32, the wafer on which the first re-distribution layer 321, the first solder pad 322, the through via, and the metal solder pad are manufactured.

In this case, the schematic sectional structural view of the formed single first substrate 32 is shown in FIG. 15A5.

S142: Place the first substrate 32 below the fan-out unit 31, and attach each second pin 352 in the second pin array to a corresponding first solder pad 322 in the first solder pad array, so that different dies 341 and 342 are interconnected through the first substrate 32.

In this embodiment, the dies are interconnected through the first substrate 32. Therefore, as shown in FIG. 15B, the first solder pads in the first solder pad array disposed on the first surface of the first substrate 32 are attached to and connected to the corresponding second pins 352 in the second pin array on the dies 341 and 342. Therefore, the different dies are interconnected through the first re-distribution layer 321 disposed on the first substrate 32.

To facilitate attachment between the first solder pads in the first solder pad array and the corresponding second pins in the second pin array, in an example, the first substrate 32 and the fan-out unit 31 may be connected through mass reflow or thermo compression bonding.

S143: Mold, by using a molding compound, the fan-out unit 31 and the first substrate 32 that are attached together, to form a molding body 33 that wraps the first pins 351, the second pins 352, and the first substrate 32.

For ease of assembly, a surface of the first pin array and a back face of the first substrate 32 need to be in a same plane. Therefore, in this embodiment, the molding compound needs to be used to mold the fan-out unit 31 and the first substrate 32 that are attached together, to form the molding body 33 that wraps the first pins 351, the second pins 352, and the first substrate 32. FIG. 15C is a corresponding schematic sectional structural view after this step is performed.

In addition, because the first pins 351 and the second pins 352 are wrapped by the molding compound, formation of the molding body 33 can improve reliability of the entire package structure.

S144: Grind a surface that is of the molding body 33 and that is away from the fan-out unit 31, to expose bottoms of the first pins in the first pin array.

This step may be: grinding the surface that is of the molding body 33 and that is away from the fan-out unit 31 by using a mechanical grinding method, to expose the bottoms of the first pins 351 in the first pin array.

FIG. 15D is a corresponding schematic sectional structural view after this step is performed.

S145: Form, at the exposed bottoms of the first pins 351, solder balls 36 electrically connected to the outside.

To connect the first pin 351 to an external circuit such as a PCB board, as shown in FIG. 3A, metal solder balls 36 are formed at the exposed bottoms of the first pins 351. To implement a better electrical connection between the first pin 351 and the solder ball 36, a solder pad 37 may be further formed between each first pin 351 and the solder ball 36.

The foregoing is an implementation of the chip packaging method provided in the embodiments. In the chip structure packaged in this implementation, short-distance and high-density interconnection of dies is implemented by using the first substrate 32. The molding body 33 is used to wrap the first pin 351, the second pin 352, and the first substrate 32, so that the fan-out unit 31 and the first substrate 32 are molded into an integral structure. In the integral structure, bottoms of first pins that are in the first pin array on the die 341 and 342 and that are electrically connected to a periphery of the chip are not wrapped by the molding body 33. In this way, the first pins may be directly electrically connected to the periphery of the chip. Therefore, based on the chip provided in this embodiment, a pin that is on the die and that is configured to electrically connect to the peripheral of the chip may be directly electrically connected to the peripheral of the chip, without using a substrate as an intermediary. Therefore, an overall size of the chip provided in this embodiment mainly depends on a size of a plurality of dies integrated together. The overall size of the chip provided in this embodiment is relatively small compared with that of a chip in the prior art, and can meet a requirement on chip miniaturization.

In addition, in this embodiment, a manner in which the dies 341 and 342 are interconnected through the first substrate 32 also facilitates the chip miniaturization.

In addition, in this embodiment, the first substrate 32 may be independently manufactured, and does not need to be manufactured on dies integrated together. Therefore, if a defect occurs in a manufacturing process of the first substrate 32, a qualified die is not discarded, thereby reducing packaging costs.

In addition, in this embodiment, a size of the first substrate 32 is sufficient provided that the substrate 32 can be attached to the second pin 352 on the die, and the size does not need to be greater than or equal to a sum of sizes of all the dies integrated together. Therefore, in this embodiment, materials consumed by the first substrate 32 can be reduced, and package costs can be greatly reduced. Such a design is also conducive to the chip miniaturization.

In addition, in this embodiment, both a line width and a line distance of the first re-distribution layer on the first substrate 32 may reach 0.4 μm. Therefore, the line width and the line distance are relatively small, and a manufacturing process is relatively simple.

In another embodiment, to facilitate an electrical connection between pins on a die and a peripheral circuit of a chip, the first pin 351 may be connected to an external circuit by using a substrate, so that the electrical connection between the chip and the peripheral circuit of the chip is not limited to sizes and an arrangement of the pins on the die. Based on this, an embodiment further provides another implementation of the chip packaging method.

Figure 16:
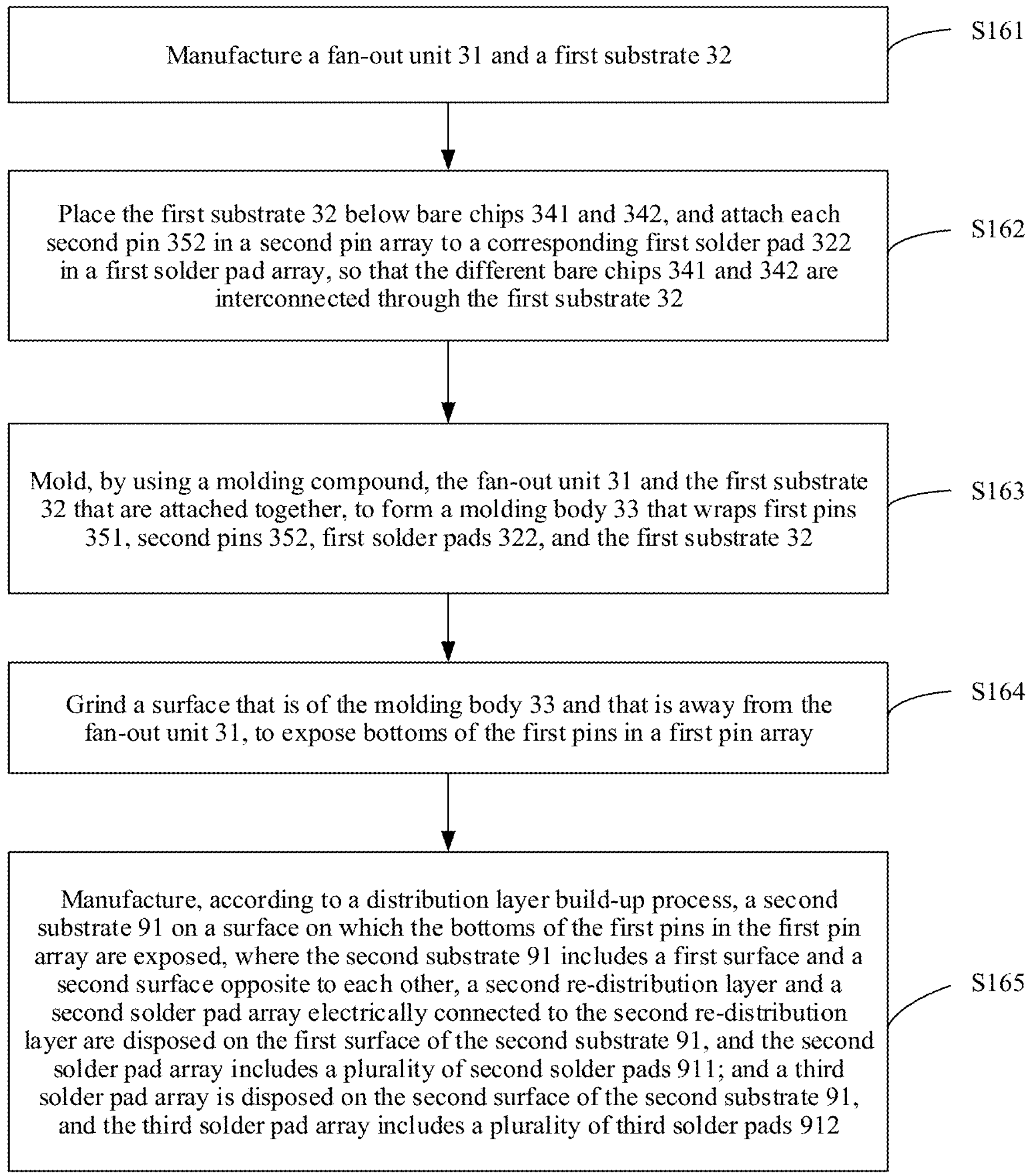
FIG. 16 is a schematic flowchart of another chip packaging method according to an embodiment.

Referring to FIG. 16, another chip packaging method provided in this embodiment includes the following steps.

S161 to S164 are the same as S141 to S144. For brevity, details are not described herein again.

S165: Manufacture, according to a distribution layer build-up process, a second substrate 91 on a surface on which the bottoms of the first pins in the first pin array are exposed, where a second re-distribution layer (not shown) is disposed on the second substrate 91, the second substrate 91 includes a first surface and a second surface opposite to each other, a second solder pad array electrically connected to the second re-distribution layer is disposed on the first surface of the second substrate 91, and the second solder pad array includes a plurality of second solder pads 911; and a third solder pad array is disposed on the second surface of the second substrate 91, and the third solder pad array includes a plurality of third solder pads 912.

This step may include the following.

A dielectric layer is coated on the ground surface that is of the molding body 33 and that is away from the fan-out unit 31, then a re-distribution layer is manufactured on a surface of the dielectric layer, and the re-distribution layer is stacked layer by layer until the second re-distribution layer is manufactured (where the second re-distribution layer is not shown in the figure). When the second re-distribution layer is manufactured, the second solder pad array corresponding to the first pin array is manufactured at a position opposite to the first pin array. The second solder pad array includes a plurality of second solder pads 911; and the second solder pads 911 are electrically connected to the second re-distribution layer.

After the second re-distribution layer and the second solder pad array are manufactured, a dielectric layer is continued to be coated, and then the third solder pad array is manufactured on a surface of the dielectric layer. The third solder pad array includes a plurality of third solder pads 912.

FIG. 10A is a corresponding schematic sectional structural view after S165 is performed.

In this embodiment, the second substrate 91 is directly manufactured on the surface that is of the molding body 33 and that is away from the fan-out unit 31. After the second substrate 91 is manufactured, the first pin on the die can be electrically connected to the second substrate 91.

It can be noted that, in this embodiment, a plurality of layers of re-distribution layers are directly disposed on the second substrate 91 manufactured on the ground surface that is of the molding body 33 and that is away from the fan-out unit 31. Therefore, the second substrate 91 may also be referred to as an RDL carrier board.

In this embodiment, the second substrate 91 is directly manufactured on the ground surface that is of the molding body 33 and that is away from the fan-out unit 31. Therefore, a cross-sectional size of the first substrate 91 is the same as a cross-sectional size of the molding body 33. The cross-sectional size of the molding body 33 is the same as a cross-sectional size of the fan-out unit 31. Therefore, the cross-sectional size of the first substrate 91 is the same as the cross-sectional size of the fan-out unit 31.

In the chip structure formed in this embodiment, the first pins 351 in the first pin array on the dies 341 and 342 are electrically connected to the corresponding second solder pads in the second solder pad array on the second substrate 91, and each third solder pad in the third solder pad array on the second substrate 91 is electrically connected to the peripheral circuit of the chip. In this way, the first pins 351 on the dies 341 and 342 are electrically connected to the peripheral circuit of the chip by using the second substrate 91. Because the second substrate 91 can provide larger line design space, density of the third solder pads 912 on the second substrate 91 may be less than density of the first pins 351 on the die. Therefore, compared with the first pins 351 on the dies 341 and 342, the third solder pads 912 on the second substrate 91 may be relatively easily electrically connected to the peripheral circuit of the chip through a soldering process. Therefore, even if the chip formed according to this embodiment includes a die with high pin density, the electrical connection between the die and the peripheral circuit of the chip can be easily implemented. Therefore, based on the chip structure formed according to this embodiment, the limitations caused by the arrangement of the pins on the die on the electrical connection between the chip and the peripheral circuit of the chip can be reduced.

In an optional embodiment, to further increase routing resources of the package structure and a quantity of packaged pins, improve integrity of a package power supply, and improve board-level reliability of the package structure, in an implementation of any one of the foregoing packaging methods, the following steps S1 and S2 may be further included.

S1: Manufacture a third substrate 101.

Figure 17:
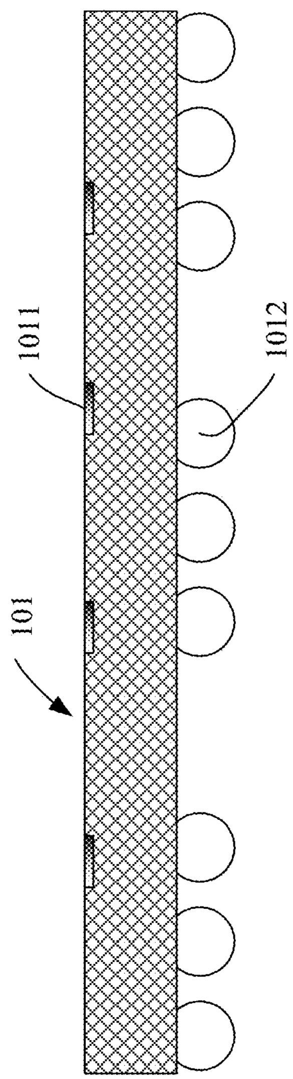
FIG. 17 is a schematic sectional structural view of a third substrate according to an embodiment.

As shown in FIG. 17, the third substrate 101 includes a first surface and a second surface that are opposite to each other, a fourth solder pad array is disposed on the first surface of the third substrate 101, a fifth solder pad array is disposed on the second surface of the third substrate 101, the fourth solder pad array includes a plurality of fourth solder pads 1011, and the fifth solder pad array includes a plurality of fifth solder pads 1012.

In this embodiment, the fourth solder pads in the fourth solder pad array on the third substrate 101 correspond to third solder pads in a third solder pad array on a second substrate 91.

The fifth solder pads 1012 in the fifth solder pad array on the third substrate 101 are configured to electrically connect to a peripheral circuit of a chip. Further, the fifth solder pads 1012 in the fifth solder pad array on the third substrate 101 are configured to electrically connect to a PCB board in a peripheral area of the chip.

It can be noted that, in this optional embodiment, the third solder pads 912 in the third solder pad array on the second substrate 91 are no longer configured to connect to an external circuit, but are configured to connect to the fourth solder pads 1011 in the fourth solder pad array on the first surface of the third substrate 101. In addition, in this optional embodiment, the fifth solder pads 1012 in the fifth solder pad array on the second surface of the third substrate 101 are electrically connected to the PCB board in the peripheral area of the chip.

After the third substrate 101 is manufactured, and after the second substrate 91 is manufactured, through the distribution layer build-up process, on the surface on which bottoms of the first pins in the first pin array are exposed, the chip packaging method provided in this embodiment may further include the following.

S2: Place the third substrate 101 below the second substrate 91, and attach each fourth solder pad 1011 in the fourth solder pad array to the corresponding third solder pad 912 in the third solder pad array, so that each fourth solder pad 1011 in the fourth solder pad array is electrically connected to the corresponding third solder pad 912 in the third solder pad array.

In another optional embodiment, to relieve stress between the first pin 351 and the second substrate 91, and further improve reliability of the entire chip structure, the packaging method in the foregoing optional embodiment may further include the following step after S2.

S3: Fill an underfill 102 between the second substrate 91 and the third substrate 101.

FIG. 11 is a corresponding schematic sectional structural view after this step is performed.

In addition, in still another optional embodiment, because a distance between the first solder pads 322 in the first solder pad array is relatively small, in a process of molding, by using a molding compound, the fan-out unit 31 and the first substrate 32 that are attached together, the molding compound may not completely wrap the first solder pads 322, causing a decrease in the reliability of the entire chip structure. Therefore, to improve a filling effect of the underfill between the first solder pads 322 in the first solder pad array, in the packaging method in any one of the foregoing embodiments, before the fan-out unit 31 and the first substrate 32 that are attached together are molded by using the molding compound, the following step may be further included.

S4: Fill the underfill 71 in a gap between the first solder pads 322 in the first solder pad array.

FIG. 8 is a corresponding schematic sectional structural view after this step is performed.

In addition, in still another optional embodiment, to improve heat dissipation performance of the package structure, in the packaging method in any one of the foregoing optional embodiments, the following step may be further included.

S5: Dispose a heat sink 111 on the second surface of the die.

FIG. 12 is a corresponding schematic sectional structural view after this step is performed.

In an example, the heat sinks 111 may be bonded to the second surfaces of the die by using a thermal adhesive, so that a desirable heat dissipation approach can be provided for a chip with high power consumption.

In addition, to better facilitate dissipation of heat generated when the dies 341 and 342 work, if back faces of the dies 341 and 342 are wrapped by the molding compound, in an optional embodiment, before S5, the following steps may be further included.

S6: Grind a surface that is of the fan-out unit 31 and that is away from the second substrate 91, to expose the second surfaces of the dies 341 and 342.

In addition, to control warp of the package structure and reliability of the structure, the heat sink 111 may be further connected to the third substrate 101. Therefore, in still another optional embodiment, based on the foregoing optional embodiment, the following step may be further included.

S7: Mask the fan-out unit 31 in the heat sink 111, and fasten an edge of the heat sink 111 to the third substrate 101.

When a cross-sectional size of the third substrate 101 may be greater than a cross-sectional size of the fan-out unit, the heat sink 111 may be bonded to the first surface of the third substrate 101 by using an adhesive.

The foregoing describes the implementations of the chip and the packaging method thereof according to the embodiments.

What is claimed is:

1. A chip, comprising: a fan-out unit, a first substrate, and a molding body, the fan-out unit comprises a plurality of dies that are integrated together and that are arranged on preset positions, and a first pin array and a second pin array are disposed on a first surface of each die; the first pin array comprises a plurality of first pins, and the second pin array comprises a plurality of second pins; and second pin arrays on adjacent dies are adjacent;

the first substrate comprises a first surface, a first re-distribution layer and a first solder pad array electrically connected to the first re-distribution layer disposed on the first surface of the first substrate, and the first solder pad array comprises a plurality of first solder pads;

the first substrate is located below the fan-out unit, the first solder pad array is disposed opposite to the second pin array, and each second pin in the second pin array is attached to a corresponding first solder pad in the first solder pad array so that different dies are interconnected through the first substrate; and the molding body is used to wrap the first pin, the second pin, and the first substrate, so that the fan-out unit and the first substrate are molded into an integral structure;

wherein the chip further comprises a heat sink disposed on a second surface of the die, and the second surface of the die is opposite to the first surface of the die;

wherein the chip further comprises a second substrate, wherein the second substrate is directly disposed below the molding body according to a distribution layer build-up process; the heat sink is spaced apart from a side surface of the molding body and a second substrate; and wherein the chip further comprises a third substrate disposed below the second substrate; and the heat sink masks the fan-out unit, and an edge of the heat sink is fastened on the third substrate.

2. The chip according to claim 1, wherein the chip further comprises a second re-distribution layer is disposed on the second substrate, the second substrate comprises a first surface and a second surface opposite to each other, a second solder pad array electrically connected to the second re-distribution layer is disposed on the first surface of the second substrate, and the second solder pad array comprises a plurality of second solder pads; and a third solder pad array is disposed on the second surface of the second substrate, and the third solder pad array comprises a plurality of third solder pads; and the second solder pad array is disposed opposite to the first pin array, and each second solder pad in the second solder pad array is electrically connected to a corresponding first pin in the first pin array.

3. The chip according to claim 1, wherein a through via electrically connected to the first re-distribution layer is disposed inside the first substrate, the through via extends to a second surface of the first substrate, and the through via is electrically connected to a periphery of the chip, wherein the second surface of the first substrate is opposite to the first surface of the first substrate.

4. The chip according to claim 1, wherein the chip further comprises a third substrate disposed below the second substrate;

the third substrate comprises a first surface and a second surface opposite to each other, a fourth solder pad array is disposed on the first surface of the third substrate, a fifth solder pad array is disposed on the second surface of the third substrate, the fourth solder pad array comprises a plurality of fourth solder pads, and the fifth solder pad array comprises a plurality of fifth solder pads;

the fourth solder pad array is opposite to the third solder pad array, and each fourth solder pad in the fourth solder pad array is electrically connected to a corresponding third solder pad in the third solder pad array; and the fifth solder pad in the fifth solder pad array is used to implement signal transmission between the chip and the periphery of the chip.

5. The chip according to claim 4, wherein an underfill is filled between the second substrate and the third substrate.

6. The chip according to claim 1, wherein the underfill is filled in a gap between the first solder pads in the first solder pad array.

7. The chip according to claim 1, wherein at least one interconnection structure is formed between different dies that are interconnected, and each interconnection structure comprises a plurality of interconnection lines.

8. The chip according to claim 7, wherein all interconnection lines in a same interconnection structure have an equal length.

9. The chip according to claim 1, wherein the first re-distribution layer comprises n layers of first re-distribution sublayers, $n \geq 1$, and n is an integer.

10. The chip according to claim 9, wherein $n \geq 2$, the n layers of first re-distribution sublayers comprise a reference layer and a line layer, and a plane in which the reference layer is located is a reference plane of the line layer.

11. The chip according to claim 1, wherein a logical chip is disposed on the first substrate.

12. A chip, comprising: a fan-out unit, a first substrate, and a molding body, the fan-out unit comprises a plurality of dies that are integrated together and that are arranged on preset positions, and a first pin array and a second pin array are disposed on a first surface of each die; the first pin array comprises a plurality of first pins, and the second pin array comprises a plurality of second pins; and second pin arrays on adjacent dies are adjacent;

the first substrate comprises a first surface, a first re-distribution layer and a first solder pad array electrically connected to the first re-distribution layer disposed on the first surface of the first substrate, and the first solder pad array comprises a plurality of first solder pads;

the first substrate is located below the fan-out unit, the first solder pad array is disposed opposite to the second pin array, and each second pin in the second pin array is attached to a corresponding first solder pad in the first solder pad array so that different dies are interconnected through the first substrate; and the molding body is used to wrap the first pin, the second pin, and the first substrate, so that the fan-out unit and the first substrate are molded into an integral structure;

the first substrate has a second surface opposite to the first surface that is directly attached to the top surface of a second substrate;

wherein the chip further comprises a third substrate disposed below the second substrate;

the third substrate comprises a first surface and a second surface opposite to each other, a fourth solder pad array is disposed on the first surface of the third substrate, a fifth solder pad array is disposed on the second surface of the third substrate, the fourth solder pad array comprises a plurality of fourth solder pads, and the fifth solder pad array comprises a plurality of fifth solder pads;

the fourth solder pad array is opposite to the third solder pad array, and each fourth solder pad in the fourth solder pad array is electrically connected to a corresponding third solder pad in the third solder pad array; and the fifth solder pad in the fifth solder pad array is used to implement signal transmission between the chip and the periphery of the chip;

wherein the third substrate is a multilayer substrate manufactured through laser grinding or a multilayer substrate manufactured through mechanical grinding.

13. A chip packaging method, comprising:

separately manufacturing a fan-out unit and a first substrate, wherein the fan-out unit comprises a plurality of dies that are integrated together and that are arranged according to preset positions, and a first pin array and a second pin array are disposed on a first surface of each die; the first pin array comprises a plurality of first pins, and the second pin array comprises a plurality of second pins; and second pin arrays on adjacent dies are adjacent; and the first substrate comprises a first surface, a first re-distribution layer and a first solder pad array electrically connected to the first re-distribution layer are disposed on the first surface of the first substrate, and the first solder pad array comprises a plurality of first solder pads;

placing the first substrate below the fan-out unit, and attaching each second pin in the second pin array to a corresponding first solder pad in the first solder pad array, so that the different dies are interconnected through the first substrate; and molding, by using a molding compound, the fan-out unit and the first substrate that are attached together, to form a molding body that wraps the first pins, the second pins, and the first substrate;

wherein the method further comprises disposing a heat sink on a second surface of the die, and the second surface of the die is opposite to the first surface of the die;

wherein the chip further comprises a second substrate, wherein the second substrate is directly disposed below the molding body according to a distribution layer build-up process; the heat sink is spaced apart from a side surface of the molding body and a second substrate; and wherein the method further comprises disposing a third substrate below a second substrate; and the heat sink masks the fan-out unit, and an edge of the heat sink is fastened on the third substrate.

14. The chip packaging method according to claim 13, further comprising:

when the molding body wraps bottoms of the first pins in the first pin array, grinding a surface that is of the molding body and that is away from the fan-out unit to expose the bottoms of the first pins in the first pin array; and manufacturing, according to a distribution layer build-up process, the second substrate on the surface on which the bottoms of the first pins in the first pin array are exposed, wherein a second re-distribution layer is disposed on the second substrate, the second substrate comprises a first surface and a second surface opposite to each other, a second solder pad array electrically connected to the second re-distribution layer is disposed on the first surface of the second substrate, and the second solder pad array comprises a plurality of second solder pads; and a third solder pad array is disposed on the second surface of the second substrate, and the third solder pad array comprises a plurality of third solder pads; and the second solder pad array is disposed opposite to the first pin array, and each second solder pad in the second solder pad array is electrically connected to a corresponding first pin in the first pin array.

15. The chip packaging method according to claim 14, wherein the manufacturing of the second substrate on the surface on which the bottoms of the first pins in the first pin array are exposed comprises:

coating a dielectric layer on the surface on which the bottoms of the first pins in the first pin array are exposed, then manufacturing a re-distribution layer on a surface of the dielectric layer, and stacking the re-distribution layer layer-by-layer until the second re-distribution layer is manufactured; and, when manufacturing the second re-distribution layer, manufacturing the second solder pad array at a position opposite to the first pin array, wherein the second solder pad array comprises a plurality of second solder pads; and one second solder pad corresponds to one second solder pad; and after the second re-distribution layer and the second solder pad array are manufactured, continuing coating a dielectric layer, and then manufacturing, on a surface of the dielectric layer, the third solder pad array comprising the plurality of third solder pads.

16. The chip packaging method according to claim 14, further comprising:

manufacturing a third substrate, wherein the third substrate comprises a first surface and a second surface opposite to each other, a fourth solder pad array is disposed on the first surface of the third substrate, a fifth solder pad array is disposed on the second surface of the third substrate, the fourth solder pad array comprises a plurality of fourth solder pads, and the fifth solder pad array comprises a plurality of fifth solder pads; and after the manufacturing of the second substrate on the surface on which the bottoms of the first pins in the first pin array are exposed, the method further comprises:

placing the third substrate below the second substrate, making the fourth solder pad array opposite to the third solder pad array, and attaching each fourth solder pad in the fourth solder pad array to a corresponding third solder pad in the third solder pad array, so that the fourth solder pad in the fourth solder pad array is electrically connected to the corresponding third solder pad in the third solder pad array.

* * * * *